US012666797B2

(12) United States Patent
Lee et al.

(10) Patent No.: US 12,666,797 B2
(45) Date of Patent: Jun. 23, 2026

(54) DISPLAY DEVICE AND METHOD OF FABRICATING THE SAME

(71) Applicant: Samsung Display Co., Ltd., Yongin-si (KR)

(72) Inventors: Duckjung Lee, Yongin-si (KR); Hye Jin Gwark, Yongin-si (KR); Jaeik Kim, Yongin-si (KR); Hwi Kim, Yongin-si (KR); Jungsun Park, Yongin-si (KR); Yeonhwa Lee, Yongin-si (KR); Joongu Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 366 days.

(21) Appl. No.: 18/465,618

(22) Filed: Sep. 12, 2023

(65) Prior Publication Data

US 2024/0196651 A1     Jun. 13, 2024

(30) Foreign Application Priority Data

Dec. 13, 2022     (KR) ........................ 10-2022-0173745

(51) Int. Cl.
| | |
|---|---|
| *H10K 59/122* | (2023.01) |
| *H10K 59/12* | (2023.01) |
| *H10K 59/121* | (2023.01) |
| *H10K 59/80* | (2023.01) |
| *H10K 59/88* | (2023.01) |

(52) U.S. Cl.
CPC ..... *H10K 59/1213* (2023.02); *H10K 59/1201* (2023.02); *H10K 59/122* (2023.02); *H10K 59/8051* (2023.02); *H10K 59/8052* (2023.02); *H10K 59/88* (2023.02)

(58) Field of Classification Search
CPC ............................ H10K 59/122; H10K 59/88
USPC ................................................. 313/498–512
See application file for complete search history.

(56) References Cited

U.S. PATENT DOCUMENTS

| | | | |
|---|---|---|---|
| 10,629,847 B2 | 4/2020 | Choung et al. | |
| 10,748,977 B2 | 8/2020 | Sim et al. | |
| 10,862,036 B2 | 12/2020 | Ke et al. | |

(Continued)

FOREIGN PATENT DOCUMENTS

| | | |
|---|---|---|
| JP | 2022-080003 A | 5/2022 |
| KR | 10-2017-0056770 A | 5/2017 |

(Continued)

*Primary Examiner* — Christopher M Raabe
(74) *Attorney, Agent, or Firm* — Womble Bond Dickinson (US) LLP

(57) ABSTRACT

A display device includes: a base substrate having a plurality of first areas and a second area adjacent to the plurality of first areas; an organic layer on the base substrate and having a groove therein corresponding to the second area; a first electrode on the organic layer and overlapping one first area from among the plurality of first areas; a first charge transport layer on the first electrode and having an edge part facing a partial region of an inner lateral surface of the organic layer that defines the groove; an emission layer covering the first charge transport layer; a second charge transport layer covering the emission layer and including an inorganic material; and a second electrode covering the second charge transport layer and overlapping a bottom surface of the organic layer defining the groove.

21 Claims, 31 Drawing Sheets

(56)     References Cited

U.S. PATENT DOCUMENTS

| | | | |
|---|---|---|---|
| 2010/0219747 A1 | 9/2010 | Tutt et al. | |
| 2014/0346484 A1 * | 11/2014 | Nendai ............ | H10K 59/80522 |
| | | | 438/23 |
| 2015/0008398 A1 * | 1/2015 | Lee ................. | H10K 59/80522 |
| | | | 438/35 |
| 2018/0233694 A1 * | 8/2018 | Ajiki ................. | H10K 59/1315 |
| 2019/0096971 A1 | 3/2019 | Ukigaya | |
| 2020/0350513 A1 * | 11/2020 | Park .................... | H10K 77/111 |
| 2022/0077251 A1 | 3/2022 | Choung et al. | |
| 2022/0077252 A1 | 3/2022 | Choung et al. | |
| 2022/0077257 A1 | 3/2022 | Choung et al. | |
| 2022/0157905 A1 | 5/2022 | Kinjo | |
| 2022/0223671 A1 | 7/2022 | Yamazaki et al. | |
| 2022/0336556 A1 * | 10/2022 | Wang .................... | H10K 71/00 |

FOREIGN PATENT DOCUMENTS

| | | | |
|---|---|---|---|
| KR | 10-2020-0069769 A | 6/2020 | |
| KR | 10-2020-0082491 A | 7/2020 | |
| KR | 10-2022-0000303 A | 1/2022 | |
| KR | 10-2022-0103040 A | 7/2022 | |

* cited by examiner

DD

400
AD
300
200

110  120  130  140

DP

DR3
DR1
DR2

DP : 110, 120, 130, 140

LD1
LD2    } 130
LD3
PDL

DISPLAY DEVICE AND METHOD OF FABRICATING THE SAME

CROSS-REFERENCE TO RELATED APPLICATION

This application claims priority to and the benefit of Korean Patent Application No. 10-2022-0173745, filed on Dec. 13, 2022, in the Korean Intellectual Property Office, the entire disclosure of which is hereby incorporated by reference.

BACKGROUND

1. Field

Aspects of embodiments of the present disclosure relate to a display device and a method of fabricating the same.

2. Description of the Related Art

Various electronic apparatuses, such as televisions, mobile phones, tablet computers, navigation systems, and game consoles, may be equipped with (e.g., may include) a display panel to display images. The display panel may include a plurality of pixels. Each of the pixels may include a driving element, such as transistor, and a display device, such as an organic light emitting diode. The display device may be formed by depositing an electrode and an emission pattern on a substrate.

A mask having a deposition opening defined therein may be used to form the emission pattern on a certain area of the substrate. Recently, a mask-less deposition process has been developed to overcome limitations of a deposition process using a mask.

SUMMARY

Embodiments of the present disclosure provide a display device in which light emitting elements are sequentially stacked and an interval between pixels is reduced to more easily provide a high-resolution display device.

Embodiment of the present disclosure also provide a method of fabricating a display device in which a separate mask is not used, simplifying a fabrication process to manufacture a high-resolution display device.

According to an embodiment of the present disclosure, a display device includes: a base substrate having a plurality of first areas and a second area adjacent to the plurality of first areas; an organic layer on the base substrate and having a groove therein corresponding to the second area; a first electrode on the organic layer and overlapping one first area from among the plurality of first areas; a first charge transport layer on the first electrode and having an edge part facing a partial region of an inner lateral surface of the organic layer that defines the groove; an emission layer covering the first charge transport layer; a second charge transport layer covering the emission layer and including an inorganic material; and a second electrode covering the second charge transport layer and overlapping a bottom surface of the organic layer defining the groove.

An edge part of the emission layer may be closer to the bottom surface of the groove than the edge part of the first charge transport layer is, and an edge part of the second charge transport layer may be closer to the bottom surface of the groove than the edge part of the emission layer is.

The display device may further include a pixel definition layer covering the inner lateral surface of the organic layer defining the groove and an edge of the first electrode.

When viewed in a vertical cross-section, a contact distance between the pixel definition layer and an edge part of the second charge transport layer may be equal to or greater than 10 nm and equal to or less than 150 nm.

When viewed in a vertical cross-section, a contact distance between the pixel definition layer and an edge part of the emission layer may be equal to or greater than 10 nm and equal to or less than 150 nm.

When viewed in a plan view, the groove may surround the first electrode.

The first electrode may be an anode electrode, the first charge transport layer may be a hole transport layer, the second charge transport layer may be an electron transport layer, and the second electrode may be a cathode electrode.

The first electrode may be a cathode electrode, the first charge transport layer may be an electron transport layer, the second charge transport layer may be a hole transport layer, and the second electrode may be an anode electrode.

A width of the groove in the organic layer may be equal to or less than 2 μm.

An angle between the inner lateral surface of the organic layer and the bottom surface of the organic layer that define the groove may be equal to or greater than 80°.

According to an embodiment of the present disclosure, a display device includes: a base substrate having a plurality of first areas and a second area adjacent to the plurality of first areas; a first organic layer on the base substrate; a second organic layer on the first organic layer and having a hole therein corresponding to the second area; a first electrode on the second organic layer and overlapping one first area from among the plurality of first areas; a first charge transport layer on the first electrode and having an edge part facing a partial region of an inner lateral surface of the second organic layer that defines the hole; an emission layer covering the first charge transport layer; a second charge transport layer covering the emission layer and including an inorganic material; and a second electrode covering the second charge transport layer and overlapping a bottom surface of the second organic layer defining the hole.

The display device may further include a pixel definition layer covering the inner lateral surface of the second organic layer defining the hole and an edge of the first electrode.

A width of the hole may increase with decreasing distance from the base substrate along a normal direction of the base substrate.

A smallest width of the hole may be equal to or less than 2 μm.

According to an embodiment of the present disclosure, a method of fabricating a display device includes: forming an organic layer on a base substrate and a plurality of first electrodes on the organic layer, the base substrate having a plurality of first areas and a second area adjacent to the plurality of first areas, the plurality of first electrodes corresponding to the plurality of first areas, respectively; forming a groove in the organic layer and corresponding to the second area; forming, on the organic layer, a first stack including a first emission structure and a first mask pattern on the first emission structure, the first emission structure overlapping a first color area from among the plurality of first areas; removing the first mask pattern; and forming a second electrode to overlap the first emission structure and the second area. The forming of the first stack includes: performing a first deposition step in which a first deposition material is provided at a first incidence angle to form, on the first electrode, a first charge transport layer having an edge part and a first charge dummy transport layer that overlaps the second area, the edge part of the first charge transport layer facing a partial region of an inner lateral surface of the organic layer that defines the groove; performing a second deposition step in which a second deposition material is provided at a second incidence angle to form an emission layer that covers the first charge transport layer and a dummy emission layer that overlaps the second area; performing a third deposition step in which a third deposition material is provided at a third incidence angle to form a second charge transport layer that covers the emission layer and a second charge dummy transport layer that overlaps the second area, the second charge transport layer including an inorganic material; forming the first mask pattern that covers a top surface of the second charge transport layer and exposes the second charge dummy transport layer; and removing the second charge dummy transport layer, the dummy emission layer, and the first charge dummy transport layer.

The first incidence angle may be less than the second incidence angle, and the second incidence angle may be less than the third incidence angle.

The first incidence angle may be equal to or greater than 50° and equal to or less than 70°, the second incidence angle may be equal to or greater than 60° and equal to or less than 80°, and the third incidence angle may be equal to or greater than 70° and less than 90°.

The method may further include, after the forming of the first stack: forming, on the organic layer, a second stack including a second emission structure and a second mask pattern on the second emission structure, the second emission structure overlapping a second color area from among the plurality of first areas; and forming, on the organic layer, a third stack including a third emission structure and a third mask pattern on the third emission structure, the third emission structure overlapping a third color area from among the plurality of first areas.

The second mask pattern and the third mask pattern may be simultaneously removed when the first mask pattern is removed.

The organic layer may include: a first organic layer on the base substrate; and a second organic layer on the first organic layer. The groove may extend through the second organic layer and may have a width that increases with decreasing distance from the base substrate along a normal direction relative to the base substrate.

BRIEF DESCRIPTION OF DRAWINGS

FIG. 8 is a cross-sectional view taken along the line I-I' of FIG. 3 according to another embodiment of the present disclosure.

FIG. 10 is a cross-sectional view taken along the line I-I' in FIG. 3 according to another embodiment of the present disclosure.

FIGS. 12 to 27 are cross-sectional views of steps of a method of fabricating a display device according to an embodiment of the present disclosure.

DETAILED DESCRIPTION

Figure 1:
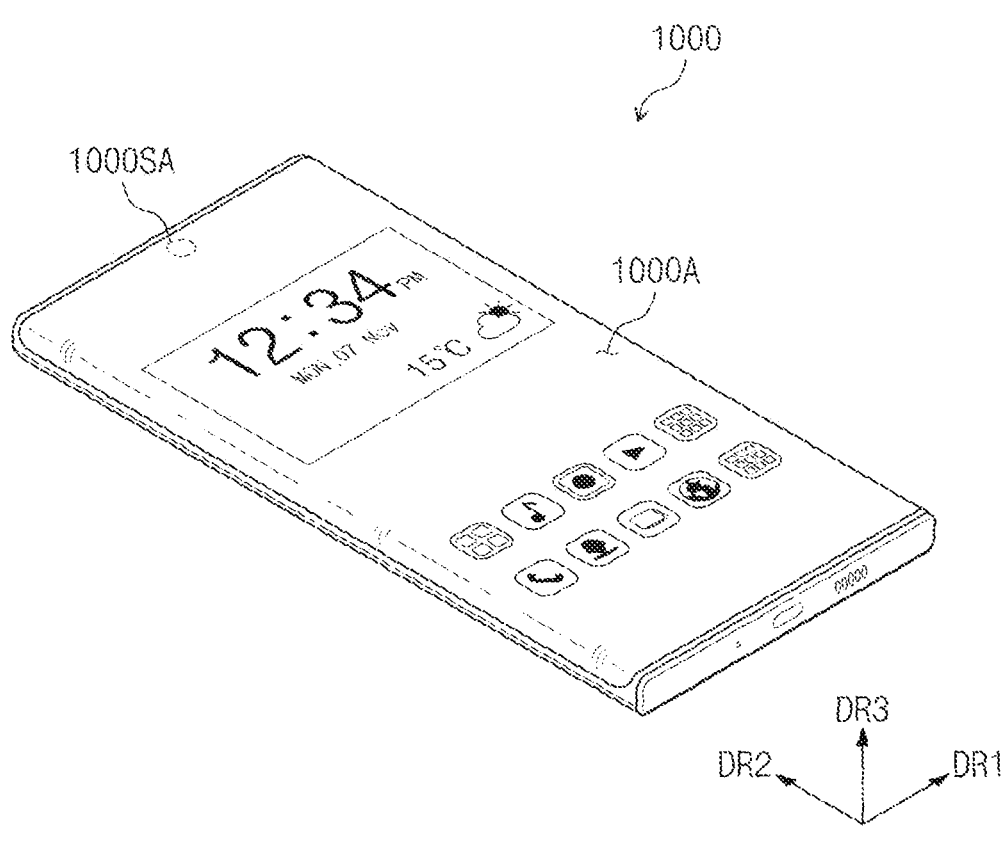
FIG. 1 is a perspective view of an electronic apparatus according to an embodiment of the present disclosure.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

Some embodiments of the present disclosure will be described hereinafter in conjunction with the accompanying drawings.

FIG. 1 is a perspective view of an electronic apparatus 1000 according to an embodiment of the present disclosure.

Referring to FIG. 1, the electronic apparatus 1000 may include a display device, and a mobile phone is illustrated as the electronic apparatus 1000 including a display device as an example. The present disclosure, however, is not limited thereto, and the electronic apparatus 1000 may be a tablet computer, a monitor, a television set, an automotive navigation system, a game console, a wearable device, etc.

The electronic apparatus 1000 may display an image at a display area 1000A. The display area 1000A may be on a plane defined by a first direction DR1 and a second direction DR2. The display area 1000A may have curved surfaces that are bent (or curved) from at least two sides of the plane. The shape of the display area 1000A, however, is not limited thereto. For example, the display area 1000A may include only the plane (e.g., may be flat on the plane) or may include a plurality of curved surfaces bent from at least two sides of the plane, for example, four curved surfaces bent from four sides of the plane.

A sensing area 1000SA may be defined to indicate a partial region of the display area 1000A. FIG. 1 depicts an embodiment having one sensing area 1000SA as an example, but the number of sensing areas 1000SA is not limited to that shown in FIG. 1. The sensing area 1000SA may be a portion of the display area 1000A having relatively high transmittance of optical signals compared to another portion of the display area 1000A. Therefore, an image may be displayed on the sensing area 1000SA, and an optical signal may be provided through the sensing area 1000SA.

The electronic apparatus 1000 may include an electronic module disposed in a region that overlaps the sensing area 1000SA. The electronic module may receive optical signals externally provided thorough (or passing through) the sensing area 1000SA or may output optical signals through the sensing area 1000SA. For example, the electronic module may be a camera module, a sensor, such as a proximity sensor that detects a distance between a substance and a mobile phone or a sensor that recognizes a part of user's body (e.g., fingerprint, iris, or face), or a compact-sized lamp that outputs light, but the present disclosure is not limited thereto.

A thickness direction of the electronic apparatus 1000 may be a third direction DR3 that is a normal direction relative to the display area 1000A (e.g., normal to the plane of the display area 1000A). The third direction DR3 may define front and rear surfaces (e.g., top and bottom surfaces) of components included in the electronic apparatus 1000.

Figure 2:
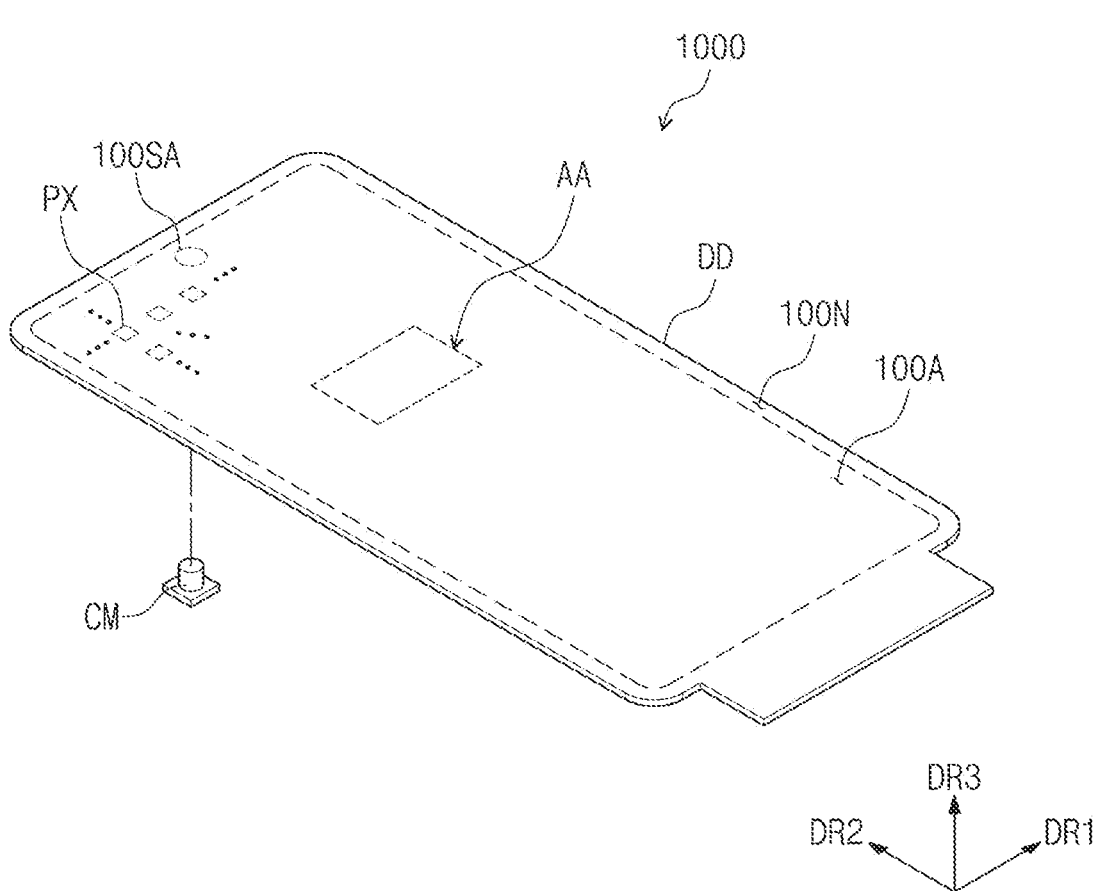
FIG. 2 is an exploded perspective view of some components of the electronic apparatus shown in FIG. 1.

FIG. 2 is an exploded perspective view of some components of the electronic apparatus 1000 shown in FIG. 1.

Referring to FIG. 2, the electronic apparatus 1000 may include a display device DD and a camera module CM. The display device DD may generate an image and may detect an external input. The camera module CM may be disposed below the display device DD. When the display device DD is defined as a first electronic module included in the electronic apparatus 1000, the camera module CM may be defined as a second electronic module included in the electronic apparatus 1000.

The display device DD may have a display area 100A and a peripheral area 100N. The display area 100A may correspond to the display area 1000A depicted in FIG. 1. A partial region of the display device DD (e.g., a partial region of the display area 1000A) may be defined as a sensing area 100SA, and the sensing area 100SA may have higher transmittance than that of another portion of the display area 100A. Therefore, the sensing area 100SA may provide the camera module CM with external (natural or environmental) light. Because the sensing area 100SA is a portion of the display area 100A, the sensing area 100SA may also display an image. The sensing area 100SA may correspond to the sensing area 1000SA depicted in FIG. 1

Pixels PX may be disposed in the display area 100A. A light emitting element may be disposed on the display area 100A, and no light emitting element may be disposed on the peripheral area 100N. The pixels PX may be disposed in the sensing area 100SA and a primary display area (e.g., an area of the display area 100A outside of the sensing area 100SA). However, the pixel PX disposed on the sensing area 100SA may be configured differently from the pixel PX disposed in the primary display area.

Figure 3:
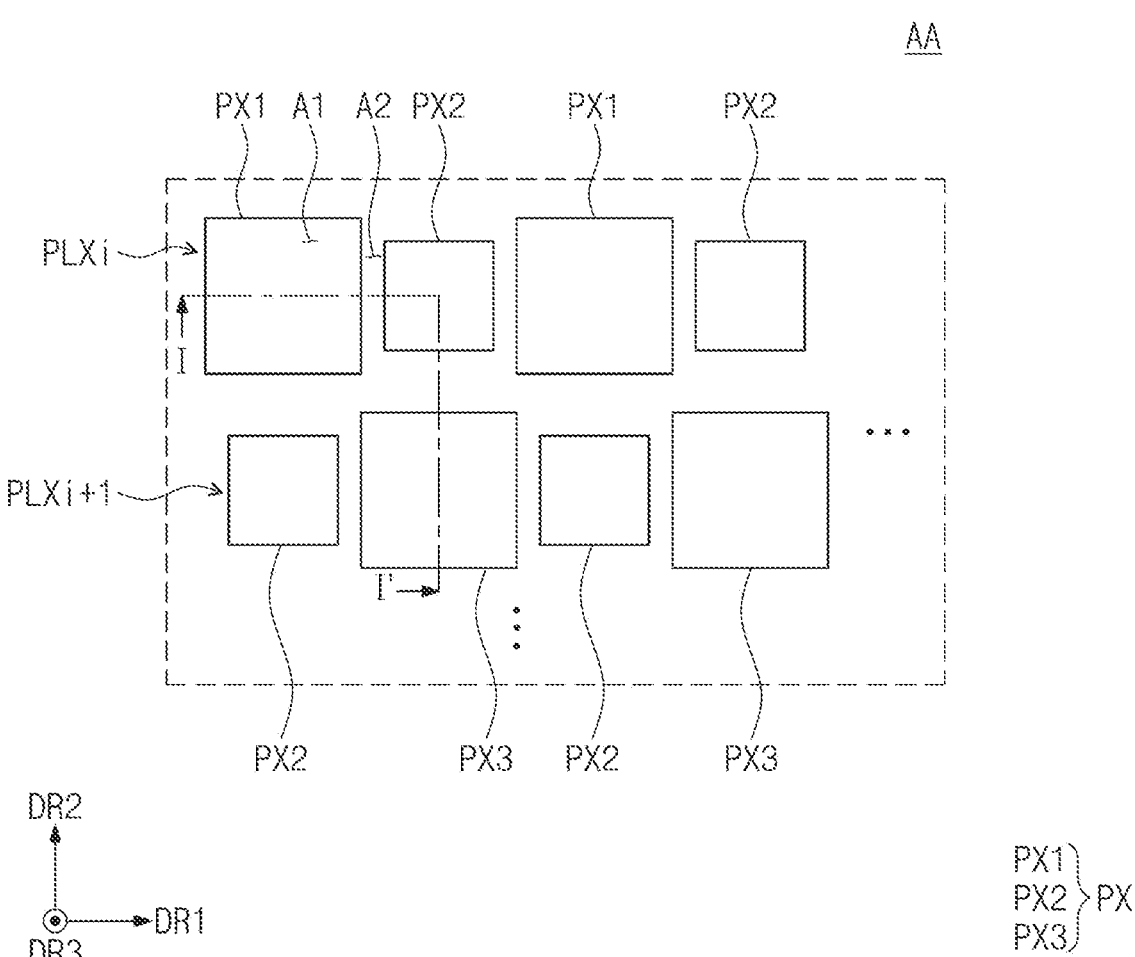
FIG. 3 is an enlarged plan view of the section AA in FIG. 2.

FIG. 3 is an enlarged plan view of the section AA in FIG. 2.

Referring to FIG. 3, a plurality of pixels PX may be disposed in the display area (see, e.g., 100A in FIG. 2). The plurality of pixels PX may be arranged in a plurality of rows PLX$_i$ and PLX$_{i+1}$. The plurality of pixels PX may include first pixels PX1 that emit light of a first color, second pixels PX2 that emit light of a second color, and third pixels PX3 that emit light of a third color.

An i$^{th}$ pixel row PLX$_i$ may include the first and second pixels PX1 and PX2 that are arranged in (e.g., that are adjacent to each other in) the first direction DR1. An (i+1)$^{th}$ pixel row PLX$_{i+1}$ may include the second and third pixels PX2 and PX3 that are arranged in (e.g., that are adjacent to each other in) the first direction DR1. Three colored pixels of the pixel rows PLX$_i$ and PLX$_{i+1}$ may be repeatedly disposed along the first direction DR1. The pixel rows PLX$_i$ and PLX$_{i+1}$ may be repeatedly disposed along the second direction DR2. FIG. 3 depicts an arrangement of the plurality of pixels PX as an example, and the plurality of pixels PX may have various suitable arrangements based on desired resolution and the like.

The display area (see, e.g., 100A in FIG. 2) may include a plurality of first areas A1 that correspond to the pixels PX and a second area A2 adjacent to the plurality of first areas A1. The second area A2 may include a groove (see, e.g., T1 in FIG. 6) that is recessed in (or depressed in) a direction opposite to the third direction DR3. The second area A2 may surround (e.g., may surround in a plan view or may extend around a periphery of) the plurality of first areas A1.

Figure 4:
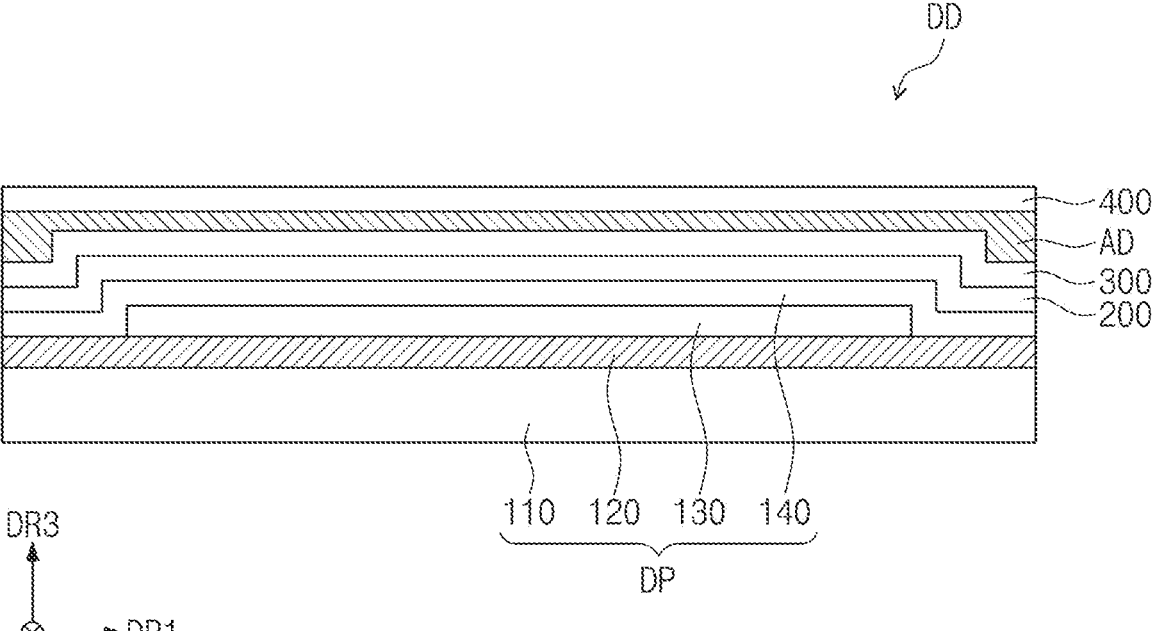
FIG. 4 is a cross-sectional view of a display device according to an embodiment of the present disclosure.

FIG. 4 is a cross-sectional view of the display device DD according to an embodiment of the present disclosure.

Referring to FIG. 4, the display device DD may include a display panel DP, a sensor layer 200, an anti-reflection layer 300, and a window 400. The anti-reflection layer 300 and the window 400 may be coupled to each other by an adhesion layer AD.

The display panel DP may be a component that substantially generates an image. The display panel DP may be an emissive display panel, for example, an organic light emitting display panel, an inorganic light emitting display panel, a quantum-dot display panel, a micro-LED display panel, or a nano-LED display panel. The display panel DP may be called a display layer.

The display panel DP may include a base substrate 110, a circuit element layer 120, a light emitting element layer 130, and an encapsulation layer 140.

The base substrate 110 may be a member that provides a base surface on which the circuit element layer 120 is disposed. The base substrate 110 may be a rigid substrate or a flexible substrate that can be bent, folded, or rolled. The base substrate 110 may be a glass substrate, a metal substrate, or a polymer substrate. The present disclosure, however, is not limited thereto, and the base substrate 110 may be an inorganic layer, an organic layer, or a composite material layer.

The base substrate 110 may be a multi-layered structure. For example, the base substrate 110 may include a first synthetic resin layer, one or more inorganic layers, and a second synthetic resin layer disposed on the one or more inorganic layers. Each of the first and second synthetic resin layers may include a polyimide-based resin, but the present disclosure is not limited thereto.

The circuit element layer 120 may be disposed on the base substrate 110. The circuit element layer 120 may include an insulating layer, a semiconductor pattern, a conductive pattern, and a signal line.

The light emitting element layer 130 may be disposed on the circuit element layer 120. The light emitting element layer 130 may include a light emitting element. For example, the light emitting element may include an organic light emitting material, an inorganic light emitting material, an organic-inorganic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 against moisture, oxygen, and foreign substances, such as dust particles. The encapsulation layer 140 may include at least one inorganic layer. The encapsulation layer 140 may include a stacked structure in which an inorganic layer, an organic layer, and an inorganic layer are stacked on each other.

The sensor layer 200 may be disposed on the display panel DP. The sensor layer 200 may detect (e.g., may be configured to detect) an external input that is applied from the outside. The external input may be a user's input. The user's input may include various types of external input, such as a part of user's body, light, heat, pen, and pressure.

A series of processes may be employed to form the sensor layer 200 on the display panel DP. In one embodiment, the sensor layer 200 may be directly disposed on the display panel DP. In this description, the phrase "directly disposed" may mean that no third component is disposed between the sensor layer 200 and the display panel DP. For example, in such an embodiment, no adhesive member is separately located between the sensor layer 200 and the display panel DP.

The anti-reflection layer 300 may be directly disposed on the sensor layer 200. The anti-reflection layer 300 may reduce a reflectance of external light that is incident from outside the display device DD. A series of processes may be employed to form the anti-reflection layer 300 on the sensor layer 200. The anti-reflection layer 300 may include color filters. The color filters may have a certain arrangement. For example, the color filters may be arranged in consideration of emission colors of pixels included in the display panel DP. The anti-reflection layer 300 may further include a black matrix adjacent to the color filters. The anti-reflection layer 300 will be further described in detail below.

In an embodiment of the present disclosure, the sensor layer 200 may be omitted. In such an embodiment, the anti-reflection layer 300 may be directly disposed on the display panel DP. In an embodiment of the present disclosure, the sensor layer 200 and the anti-reflection layer 300 may be interchangeably positioned.

In an embodiment of the present disclosure, the display device DD may further include an optical layer disposed on the anti-reflection layer 300. For example, a series of processes may be employed to form the optical layer on the anti-reflection layer 300. The optical layer may control a direction of light incident from the display panel DP to increase front-side brightness of the display device DD. For example, the optical layer may include an organic insulating layer having openings that are defined to correspond to emission areas of pixels included in the display panel DP and may also include a high-refractive layer that covers the organic insulating layer and fills the openings. The high-refractive layer may have a refractive index greater than that of the organic insulating layer.

The window 400 may provide a front surface of the electronic apparatus (see, e.g., 1000 in FIG. 1). The window 400 may include one of a glass film and a synthetic resin film as a base film. The window 400 may further include an anti-reflection layer or an anti-fingerprint layer. The window 400 may include a glass film or a synthetic resin film.

Figure 5:
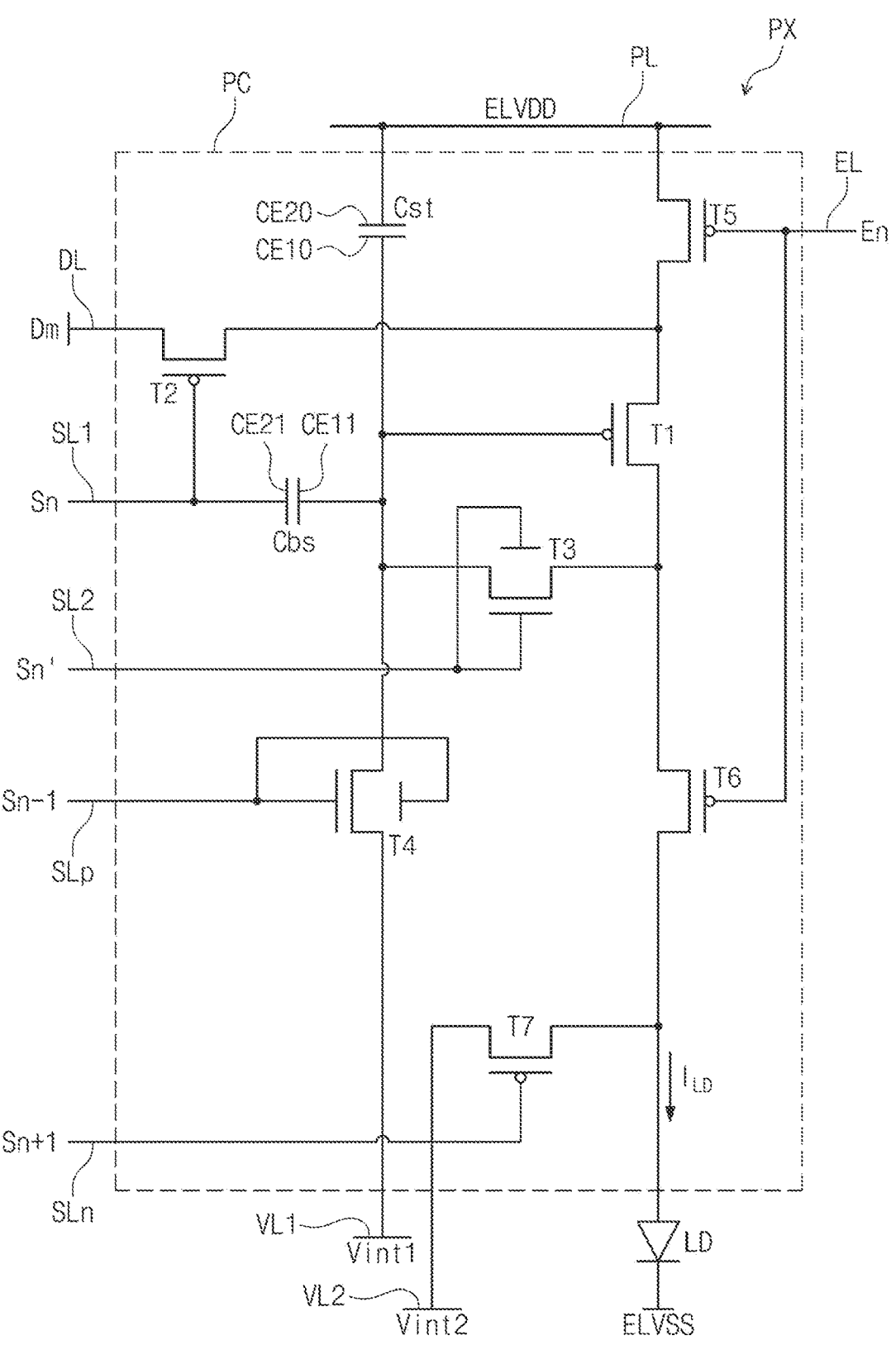
FIG. 5 is an equivalent circuit diagram of a pixel according to an embodiment of the present disclosure.

FIG. 5 is an equivalent circuit diagram of the pixel PX according to an embodiment of the present disclosure.

Referring to FIG. 5, an equivalent circuit diagram schematically illustrates one of the plurality of pixels PX depicted in FIG. 2. The pixel PX may include a light emitting element LD and a pixel circuit PC. The light emitting element LD may be a component included in the light emitting element layer 130 in FIG. 4, and the pixel circuit PC may be a component included in the circuit element layer 120 in FIG. 4.

The pixel circuit PC may include a plurality of transistors (e.g., thin film transistors) T1 to T7 and a storage capacitor Cst. The plurality of transistors T1 to T7 and the storage capacitor Cst may be electrically connected to signal lines SL1, SL2, SLp, SLn, EL, and DL, a first initialization voltage line VL1, a second initialization voltage line VL2 (e.g., an anode initialization voltage line), and a driving voltage line PL.

The plurality of transistors T1 to T7 may include a driving transistor T1 (e.g., a first transistor), a switching transistor T2 (e.g., a second transistor), a compensation transistor T3 (e.g., a third transistor), a first initialization transistor T4 (e.g., a fourth transistor), an operation control transistor T5 (e.g., a fifth transistor), an emission control transistor T6 (e.g., a sixth transistor), and a second initialization transistor T7 (e.g., a seventh transistor).

The light emitting element LD may include a first electrode (e.g., an anode electrode or a pixel electrode) and a second electrode (e.g., a cathode electrode or a common electrode). The first electrode of the light emitting element LD may be connected, through the emission control transistor T6, to the driving transistor T1 and may be provided with a driving current $I_{LD}$, and the second electrode of the light emitting element LD may be provided with a low-power voltage ELVSS. The light emitting element LD may generate (e.g., may emit) light having a brightness corresponds to the driving current $I_{LD}$.

At least one of the plurality of transistors T1 to T7 may be an NMOS (n-channel MOSFET), and at least another thereof may be a PMOS (p-channel MOSFET). For example, from among the plurality of transistors T1 to T7, the compensation transistor T3 and the first initialization transistor T4 may be NMOS's (n-channel MOSFET's) and the others may be PMOS's (p-channel MOSFET's).

According to an embodiment of the present disclosure, from among the plurality of transistors T1 to T7, the compensation transistor T3, the first initialization transistor T4, and the second initialization transistor T7 may be NMOS's and the others may be PMOS's. According to an embodiment of the present disclosure, from among the plurality of transistors T1 to T7, only one may be an NMOS and the others may be PMOS's. According to an embodiment of the present disclosure, all of the transistors T1 to T7 may be NMOS's or PMOS's.

The signal lines SL1, SL2, SLp, SLn, EL, and DL may include a first now scan line (e.g., a first scan line) SL1 that transmits a first scan signal Sn, a second now scan line (e.g., a second scan line) SL2 that transmits a second scan signal Sn', a prior scan line SLp that transmits a prior scan signal Sn−1 to the first initialization transistor T4, an emission control line EL that transmits an emission control signal En to the operation control transistor T5 and the emission control transistor T6, a next scan line SLn that transmits a next scan signal Sn+1 to the second initialization transistor T7, and a data line DL that transmits a data signal Dm and intersects the first now scan line SL1.

The driving voltage line PL may transmit a driving voltage ELVDD to the driving transistor T1, and the first initialization voltage line VL1 may transmit an initialization voltage Vint1 that initializes the driving transistor T1 and the first electrode of the light emitting element LD.

A gate of the driving transistor T1 may be connected to the storage capacitor Cst, a source of the driving transistor T1 may be connected through the operation control transistor T5 to the driving voltage line PL, and a drain of the driving transistor T1 may be electrically connected through the emission control transistor T6 to the first electrode of the light emitting element LD. In accordance with a switching operation of the switching transistor T2, the driving transistor T1 may receive the data signal Dm to supply the light emitting element LD with the driving current $I_{LD}$.

A gate of the switching transistor T2 may be connected to the first now scan line SL1 that transmits the first scan signal Sn, a source of the switching transistor T2 may be connected to the data line DL, and a drain of the switching transistor T2 may be connected to the source of the driving transistor T1 and connected through the operation control transistor T5 to the driving voltage line PL. In response to the first scan signal Sn transmitted through the first now scan line SL1, the switching transistor T2 may be turned on to perform a switching operation by which the source of the driving transistor T1 receives the data signal Dm transmitted to the data line D.

A gate of the compensation transistor T3 may be connected to the second now scan line SL2. A drain of the compensation transistor T3 may be connected to the drain of the driving transistor T1 and connected through the emission control transistor T6 to the first electrode of the light emitting element LD. A source of the compensation transistor T3 may be connected to a first electrode CE10 of the storage capacitor Cst and the gate of the driving transistor T1. In addition, a source of the compensation transistor T3 may be connected to a drain of the first initialization transistor T4.

In response to the second scan signal Sn' transmitted through the second now scan line SL2, the compensation transistor T3 may be turned on to electrically connect the gate of the driving transistor T1 to the drain of the driving transistor T1, thereby diode-connecting the driving transistor T1.

A gate of the first initialization transistor T4 may be connected to the prior scan line SLp. A source of the first initialization transistor T4 may be connected to the first initialization voltage line VL1 and a source of the second initialization transistor T7. The drain of the first initialization transistor T4 may be connected to the first electrode CE10 of the storage capacitor Cst, the source of the compensation transistor T3, and the gate of the driving transistor T1. In response to the prior scan signal Sn−1 transmitted through the prior scan line SLp, the first initialization transistor T4 may be turned on to provide the gate of the driving transistor T1 with the initialization voltage Vint1 to perform an initialization operation that initializes a voltage of the gate of the driving transistor T1.

A gate of the operation control transistor T5 may be connected to the emission control line EL, an operation control source of the operation control transistor T5 may be connected to the driving voltage line PL, and a drain of the operation control transistor T5 may be connected to the source of the driving transistor T1 and the drain of the switching transistor T2.

A gate of the emission control transistor T6 may be connected to the emission control line EL, an emission control source of the emission control transistor T6 may be connected to the drain of the driving transistor T1 and the drain of the compensation transistor T3, and a drain of the emission control transistor T6 may be electrically connected to a drain of the second initialization transistor T7 and the first electrode of the light emitting element LD.

In response to the emission control signal En transmitted through the emission control line EL, the operation control transistor T5 and the emission control transistor T6 may be simultaneously (or concurrently) turned on to provide the light emitting element LD with the driving voltage ELVDD to allow the driving current $I_{LD}$ to flow through the light emitting element LD.

The gate of the second initialization transistor T7 may be connected to the next scan line SLn, the drain of the second initialization transistor T7 may be connected to the drain of the emission control transistor T6 and the first electrode of the light emitting element LD, and a source of the second initialization transistor T7 may be connected to the second initialization voltage line VL2 and may be provided with an anode initialization voltage Vint2. In response to the next scan signal Sn+1 transmitted through the next scan line SLn, the second initialization transistor T7 may be turned on to initialize the first electrode of the light emitting element LD.

In another embodiment, the second initialization transistor T7 may be connected to the emission control line EL and may operate in response to the emission control signal En. A source and a drain may be interchangeably positioned based on a kind (e.g., p-type or n-type) of transistor.

The storage capacitor Cst may include the first electrode CE10 and a second electrode CE20. The first electrode CE10 of the storage capacitor Cst may be connected to the gate of the driving transistor T1, and the second electrode CE20 of the storage capacitor Cst may be connected to the driving voltage line PL. The storage capacitor Cst may store charges that correspond to a difference between the driving voltage ELVDD and the voltage of the gate of the driving transistor T1.

A boosting capacitor Cbs may include a first electrode CE11 and a second electrode CE21. The first electrode CE11 of the boosting capacitor Cbs may be connected to the first electrode CE10 of the storage capacitor Cst, and the second electrode CE21 of the boosting capacitor Cbs may be provided with the first scan signal Sn. The boosting capacitor Cbs may increase the voltage of the gate of the driving transistor T1 at the time when the supply of the first scan signal Sn is interrupted, which may compensate a voltage drop of the gate of the driving transistor T1.

The following will describe a detailed operation of each pixel PX according to an embodiment.

During an initialization period, when the prior scan signal Sn−1 is supplied through the prior scan line SLp, the first initialization transistor T4 may be turned on in response to the prior scan signal Sn−1, and the driving transistor T1 may be initialized by the initialization voltage Vint1 supplied from the first initialization voltage line VL1.

During a data programming period, when the first scan signal Sn and the second scan signal Sn' are supplied through the first now scan line SL1 and the second now scan line SL2, the switching transistor T2 and the compensation transistor T3 may be turned on in response to the first scan signal Sn and the second scan signal Sn'. In this case, the driving transistor T1 may be diode-connected by the turned-on compensation transistor T3 and may be biased in a forward direction (e.g., may be forward biased).

The gate of the driving transistor T1 may be provided with a compensation voltage Dm+Vth (where Vth is negative) that is obtained by subtracting a threshold voltage (Vth) of the driving transistor T1 from the data signal Dm supplied from the data line DL.

The storage capacitor Cst may be provided at its opposite ends with the driving voltage ELVDD and the compensation voltage Dm+Vth and may store charges that correspond to a voltage difference between the opposite ends of the storage capacitor Cst.

During an emission period, the operation control transistor T5 and the emission control transistor T6 may be turned on by the emission control signal En supplied from the emission control line EL. The driving current $I_{LD}$ may occur due to a difference between the driving voltage ELVDD and a voltage of the gate of the driving transistor T1, and the driving current $I_{LD}$ may be supplied through the emission control transistor T6 to the light emitting element LD.

In the illustrated embodiment, at least one of the plurality of transistors T1 to T7 may include an oxide-containing semiconductor layer, and the others of the plurality of transistors T1 to T7 may include a silicon-containing semiconductor layer.

For example, the driving transistor T1, which directly affects the brightness of the display device, may be configured to include a semiconductor layer formed of polysilicon having high reliability, and therefore, the display device may achieve high brightness and resolution.

As an oxide semiconductor has high carrier mobility and low leakage current, a large voltage drop may not occur even when during a long driving time. For example, a low-frequency operation may be possible because there is no large color change in image caused by voltage drop even during the low-frequency operation.

Because an oxide semiconductor has low leakage current as discussed above, the oxide semiconductor may be used to form at least one of the second initialization transistor T7, the first initialization transistor T4, and the compensation transistor T3 connected to the gate of the driving transistor T1, such that it may be possible to prevent a leakage current that can flow to the gate while also reducing power consumption.

Figure 6:
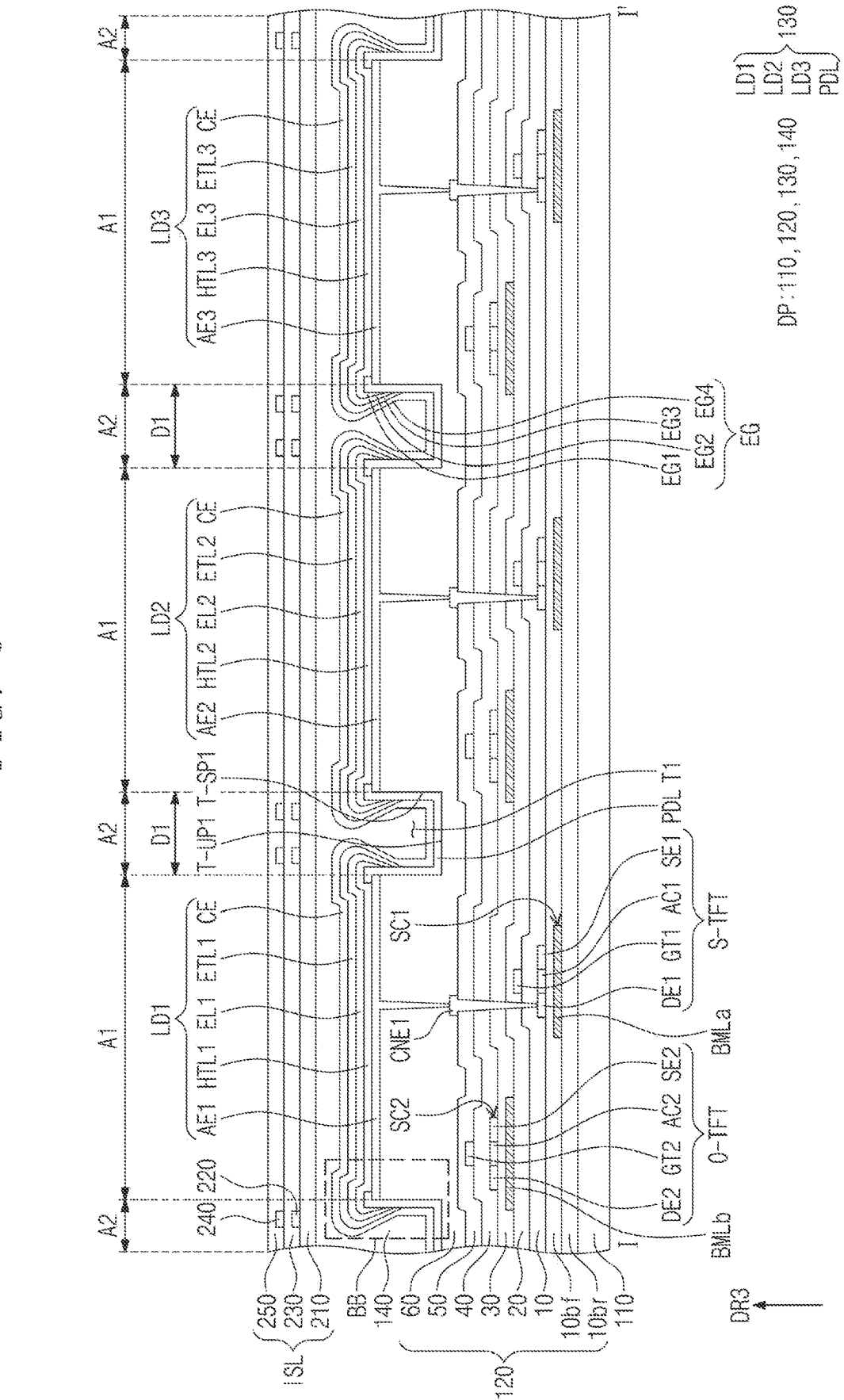
FIG. 6 is a cross-sectional view taken along the line I-I' of FIG. 3.

FIG. 6 is a cross-sectional view taken along the line I-I' of FIG. 3.

Referring to FIG. 6, a first light emitting element LD1, a second light emitting element LD2, a third light emitting element LD3, a silicon transistor S-TFT, and an oxide transistor O-TFT are illustrated.

The base substrate 110 may have a plurality of first areas A1 and a second area A2 disposed adjacent to the plurality of first areas A1. The second area A2 may be a region that corresponds to a groove T1 defined in a sixth insulating layer 60. The circuit element layer 120 may include a barrier layer $10_{br}$, a buffer layer $10_{bf}$, and first to sixth insulating layers 10 to 60.

The barrier layer $10_{br}$ may be disposed on the base substrate 110. The barrier layer $10_{br}$ may prevent introduction of foreign substances from the outside. The barrier layer $10_{br}$ may include at least one inorganic layer. The barrier layer $10_{br}$ may include a silicon oxide layer and a silicon nitride layer. Each of the silicon oxide layer and the silicon nitride layer may be provided in plural, and the silicon oxide layers and the silicon nitride layers may be alternately stacked with each other.

A first shield electrode BMLa may be disposed on the barrier layer $10_{br}$. The first shield electrode BMLa may include metal. The first shield electrode BMLa may include molybdenum (Mo), which has good heat-resistance, a molybdenum-containing alloy, titanium (Ti), or a titanium-containing alloy. The first shield electrode BMLa may receive a bias voltage. The first shield electrode BMLa may receive a power voltage. The first shield electrode BMLa may prevent the silicon transistor S-TFT from being affected by a polarization-induced electric potential. The first shield electrode BMLa may prevent external light from reaching the silicon transistor S-TFT. In an embodiment of the present disclosure, the first shield electrode BMLa may be a floating electrode that is isolated from other electrodes or wiring lines.

The buffer layer $10_{bf}$ may be disposed on the barrier layer $10_{br}$. The buffer layer $10_{bf}$ may prevent metal elements or impurities from diffusing from the base substrate 110 toward a first semiconductor pattern SC1 disposed above. The buffer layer $10_{bf}$ may include at least one inorganic layer. The buffer layer $10_{bf}$ may include a silicon oxide layer and a silicon nitride layer.

The first semiconductor pattern SC1 may be disposed on the buffer layer $10_{bf}$. The first semiconductor pattern SC1 may include a silicon semiconductor. The silicon semiconductor may include amorphous silicon or polycrystalline silicon. For example, the first semiconductor pattern SC1 may include low-temperature polysilicon.

FIG. 6 shows a portion of the first semiconductor pattern SC1, and the first semiconductor pattern SC1 may be further disposed on another region. The first semiconductor pattern SC1 may be arranged with a specific arrangement or configuration over a pixel. The first semiconductor pattern SC1 may have electrical properties that are changed based on whether the first semiconductor pattern SC1 is doped or not. The first semiconductor pattern SC1 may include a first region whose conductivity is high and a second region whose conductivity is low. The first region may be doped with n-type or p-type impurities. A p-type transistor may include a doped region implanted with p-type impurities, and an n-type transistor may include a doped region implanted with n-type impurities. The second region may be an undoped region or may be a doped region implanted with impurities having concentration is less than that of impurities doped in the first region.

The first region may have conductivity greater than that of the second region and may substantially act as an electrode or a signal line. The second region may substantially correspond to a channel (or an active region) of a transistor. For example, a portion of the first semiconductor pattern SC1 may be a channel of a transistor, another portion of the first semiconductor pattern SC1 may be a source or drain of a transistor, and still another portion of the first semiconductor pattern SC1 may be a connection electrode or a connection signal line.

The silicon transistor S-TFT may have a first source region SE1, a first active region AC1, and a first drain region DE1 that are formed from the first semiconductor pattern SC1. When viewed in vertical cross-section, the first source region SE1 and the first drain region DE1 may extend in opposite directions from the first active region AC1.

The first insulating layer 10 may be disposed on the buffer layer $10_{bf}$. The first insulating layer 10 may cover the first semiconductor pattern SC1. The first insulating layer 10 may be an inorganic layer. The first insulating layer 10 may be a single-layer silicon oxide layer. The first insulating layer 10 may have a single-layer or multi-layer structure. An inorganic layer of the circuit element layer 120, which will be described below, may have a single-layer or multi-layer structure and may include, but is not limited to, the material discussed above.

A first gate GT1 of the silicon transistor S-TFT may be disposed on the first insulating layer 10. The first gate GT1 may be a portion of a metal pattern. The first gate GT1 may overlap the first active region AC1. The first gate GT1 may act as a mask in a process during which the first semiconductor pattern SC1 is doped.

The first insulating layer 10 may be provided thereon with the second insulating layer 20 that covers the first gate GT1. The second insulating layer 20 may be provided thereon with an upper electrode that overlaps the first gate GT1.

A second shield electrode BMLb may be disposed on the second insulating layer 20. The second shield electrode BMLb may be disposed below the oxide transistor O-TFT. In an embodiment of the present disclosure, the second shield electrode BMLb may be omitted. According to an embodiment of the present disclosure, the first shield electrode BMLa may extend to a location below the oxide transistor O-TFT to replace the second shield electrode BMLb.

The third insulating layer 30 may be disposed on the second insulating layer 20. A second semiconductor pattern SC2 may be disposed on the third insulating layer 30. The second semiconductor pattern SC2 may include a second active region AC2 of the oxide transistor O-TFT. The second semiconductor pattern SC2 may include an oxide semiconductor. The second semiconductor pattern SC2 may include a transparent conductive oxide (TCO), such as indium tin oxide (ITO), indium zinc oxide (IZO), indium gallium zinc oxide (IGZO), zinc oxide (ZnO), or indium oxide ($In_2O_3$).

An oxide semiconductor may have a plurality of regions that are divided based on whether or not the transparent conductive oxide is reduced or not. A region (e.g., a reducing or reduced region) at where the transparent conductive oxide is reduced may have conductivity greater than that of a region (e.g., a non-reducing or non-reduced region) at where the transparent conductive oxide is not reduced. The reducing region may substantially act as a signal line or a source/drain of a transistor. The non-reducing region may substantially correspond to a semiconductor region (e.g., a channel) of a transistor. For example, a partial region of the second semiconductor pattern SC2 may be a semiconductor region of a transistor, another partial region of the second semiconductor pattern SC2 may be a source/drain region of a transistor, and still another partial region of the second semiconductor pattern SC2 may be a signal transfer region.

The fourth insulating layer 40 may be disposed on the third insulating layer 30. The fourth insulating layer 40 may cover the second semiconductor pattern SC2. A second gate GT2 of the oxide transistor O-TFT may be disposed on the fourth insulating layer 40. The second gate GT2 of the oxide transistor O-TFT may be a portion of a metal pattern. The second gate GT2 of the oxide transistor O-TFT may overlap the second active region AC2 of the oxide transistor O-TFT.

The fourth insulating layer 40 may be provided thereon with the fifth insulating layer 50 that covers the second gate GT2. Each of the first to fifth insulating layers 10 to 50 may be an inorganic layer.

A first connection electrode CNE1 may be disposed on the fifth insulating layer 50. The first connection electrode CNE1 may be coupled to the first drain region DE1 of the silicon transistor S-TFT through a contact hole (e.g., a contact opening) that penetrates (or passes through) the first to fifth insulating layers 10 to 50.

The sixth insulating layer 60 (e.g., an organic layer) may be disposed on the fifth insulating layer 50. The sixth insulating layer 60 may have a groove T1 defined therein to correspond to the second area A2. The groove T1 may be defined by an inner lateral surface T-SP1 and a bottom surface T-UP1 of the sixth insulating layer 60. When viewed in a plan view, the groove T1 may surround a first anode electrode AE1, a second anode electrode AE2, and a third anode electrode AE3.

The groove T1 defined in the sixth insulating layer 60 may have a width D1 equal to or less than about 2 μm. When the width D1 of the groove T1 defined in the sixth insulating layer 60 is more than about 2 μm, an excessively large interval may be provided between the first to third light emitting elements LD1 to LD3. In this case, the number of the light emitting elements LD1 to LD3 disposed in a same area may be reduced such that the display area (see, e.g., 100A in FIG. 2) may not provide a desired resolution.

An angle of equal to or greater than about 80° may be provided between the inner lateral surface T-SP1 and the bottom surface T-UP1 that define the groove T1 in the sixth insulating layer 60. FIG. 6 depicts, by way of example, that the inner lateral surface T-SP1 and the bottom surface T-UP1 form an angle of about 90° to define the groove T1 in the sixth insulating layer 60. When the angle between the inner lateral surface T-SP1 and the bottom surface T-UP1 is less than about 80°, the inner lateral surface T-SP1 may have an excessively large inclination and, thus, sequentially stacked first to fourth edge parts EG1 to EG4 may not be stably disposed.

The sixth insulating layer 60 may be an organic layer including an organic material. For example, the sixth insulating layer 60 may include a general universal polymer, such as benzocyclobutene (BCB), polyimide, hexamethyldisiloxane (HMDSO), polymethylmethacrylate (PMMA), and polystyrene (PS), a polymer derivative having a phenol group, an acryl-based polymer, an imide-based polymer, an aryl ether-based polymer, an amide-based polymer, a fluoride-based polymer, a p-xylene-based polymer, a vinyl alcohol-based polymer, or any blend thereof.

The first to third light emitting elements LD1 to LD3 may be disposed on the sixth insulating layer 60. The first light emitting element LD1 may include a first anode electrode AE1, a first hole transport layer HTL1, a first emission layer EL1, a first electron transport layer ETL1, and a cathode electrode CE. The second light emitting element LD2 may include a second anode electrode AE2, a second hole transport layer HTL2, a second emission layer EL2, a second electron transport layer ETL2, and a cathode electrode CE. The third light emitting element LD3 may include a third anode electrode AE3, a third hole transport layer HTL3, a third emission layer EL3, a third electron transport layer ETL3, and a cathode electrode CE. The cathode electrodes CE of the first to third light emitting elements LD1 to LD3 may be formed as one common layer.

Each of the first to third anode electrodes AE1 to AE3 may be disposed on the sixth insulating layer 60. Each of the first to third anode electrodes AE1 to AE3 (referred to hereinafter as first electrodes) may overlap a corresponding one of the plurality of first area A1. Each of the first electrodes AE1, AE2, and AE3 may be disposed on the sixth insulating layer 60 and may overlap a corresponding one of the plurality of first areas A1. Each of the first electrodes AE1, AE2, and AE3 may be a transmissive electrode, a transflective electrode, or a reflective electrode.

A pixel definition layer PDL may cover the inner surface T-SP1 that defines the groove T1 in the sixth insulating layer 60 and may also cover an edge of each of the first electrodes AE1, AE2, and AE3. Because the pixel definition layer PDL covers only the edge (or end) of each of the first electrodes AE1, AE2, and AE3, the pixel definition layer PDL may expose most of a top surface of each of the first electrodes AE1, AE2, and AE3. Because the pixel definition layer PDL covers only the edge (or end) of each of the first electrodes AE1, AE2, and AE3, emission efficiency may not be reduced due to concentration of current on the edge of each of the first electrodes AE1, AE2, and AE3.

The pixel definition layer PDL may be provided in the form of a thin film that is disposed along the inner lateral surface T-SP1 and the bottom surface T-UP1 of the sixth insulating layer 60 and along the edge of each of the first electrodes AE1, AE2, and AE3. Therefore, the pixel definition layer PDL may maintain a shape of the groove T1. The pixel definition layer PDL may have a thickness less than a depth of the groove T1 in the third direction DR3.

The pixel definition layer PDL may be an inorganic layer including an inorganic material. The pixel definition layer PDL may exhibit light-absorbing properties and, for example, may have a black color. The pixel definition layer PDL may include a black coloring agent. The black coloring agent may include a carbon black, metal, such as chromium or an oxide thereof.

The first, second, and third hole transport layers HTL1, HTL2, and HTL3 (referred to hereinafter as first charge transport layers) may be respectively disposed on the first electrodes AE1, AE2, and AE3. For example, the first hole transport layer HTL1 may be disposed on the first anode electrode AE1. The second hole transport layer HTL2 may be disposed on the second anode electrode AE2. The third hole transport layer HTL3 may be disposed on the third anode electrode AE3.

Each of the first charge transport layers HTL1, HTL2, and HTL3 may have a first edge part EG1 that protrudes from one of the plurality of first areas A1 toward its adjacent second area A2. The first edge part EG1 may face a partial region of the inner lateral surface T-SP1 that defines the groove T1 in the sixth insulating layer 60. The first edge part EG1 may cover an end of the pixel definition layer PDL and may have a thickness that decreases with decreasing distance from (e.g., as it approaches) the bottom surface T-UP1 of the sixth insulating layer 60. A portion of the first edge part EG1 may have a wedge shape when viewed in a vertical cross-section. However, the shape of the first edge part EG1 may be variously changed without being limited thereto.

The first charge transport layers HTL1, HTL2, and HTL3 may respectively cover top surfaces of the first electrodes AE1, AE2, and AE3 that are exposed by the pixel definition layer PDL. The first edge part EG1 of each of the first charge transport layers HTL1, HTL2, and HTL3 may cover the end of the pixel definition layer PDL. Thus, the first electrodes AE1, AE2, and AE3 may be respectively sealed by the first charge transport layers HTL1, HTL2, and HTL3.

The first to third emission layers EL1 to EL3 (referred to hereinafter as emission layers) may be respectively disposed on the first charge transport layers HTL1, HTL2, and HTL3. For example, the first emission layer EL1 may be disposed on the first hole transport layer HTL1. The second emission layer EL2 may be disposed on the second hole transport layer HTL2. The third emission layer EL3 may be disposed on the third hole transport layer HTL3.

Each of the emission layers EL1, EL2, and EL3 may include a second edge part EG2 that protrudes from one of the plurality of first areas A1 toward the second area A2. The second edge part EG2 may face a partial region of the inner lateral surface T-SP1 that defines the groove T1 in the sixth insulating layer 60. The second edge part EG2 may cover the first edge part EG1 and may have a thickness that decreases with decreasing distance from the bottom surface T-UP1 of the sixth insulating layer 60. A portion of the second edge part EG2 may have a wedge shape when viewed in a vertical cross-section. However, the shape of the second edge part EG2 may be variously changed without being limited thereto.

The emission layers EL1, EL2, and EL3 may cover exposed top surfaces of the first charge transport layers HTL1, HTL2, and HTL3, respectively. The emission layers EL1, EL2, and EL3 may seal the first charge transport layers HTL1, HTL2, and HTL3, respectively. The emission layers EL1, EL2, and EL3 may include a light emitting material. The emission layers EL1, EL2, and EL3 may emit light rays having colors that are different from each other. For example, the first emission layer EL1 may emit red light, the second emission layer EL2 may emit green light, and the third emission layer EL3 may emit blue light.

The first, second, and third electron transport layers ETL1, ETL2, and ETL3 (referred to hereinafter as second charge transport layers) may be respectively disposed on the emission layers EL1, EL2, and EL3. For example, the first electron transport layer ETL1 may be disposed on the first emission layer EL1. The second electron transport layer ETL2 may be disposed on the second emission layer EL2. The third electron transport layer ETL3 may be disposed on the third emission layer EL3.

Each of the second charge transport layers ETL1, ETL2, and ETL3 may include a third edge part EG3 that protrudes from one of the plurality of first areas A1 toward its adjacent second area A2. The third edge part EG3 may face a partial region of the inner lateral surface T-SP1 that defines the groove T1 in the sixth insulating layer 60. The third edge part EG3 may cover the second edge part EG2 and may have a thickness that decreases with decreasing distance from the bottom surface T-UP1 of the sixth insulating layer 60. A portion of the third edge part EG3 may have a wedge shape when viewed in a vertical cross-section. However, the shape of the third edge part EG3 may be variously changed without being limited thereto.

The second charge transport layers ETL1, ETL2, and ETL3 may cover exposed top surfaces of the emission layers EL1, EL2, and EL3, respectively. The second edge parts EG2 may be covered with the third edge parts EG3 of the second charge transport layers ETL1, ETL2, and ETL3. The second charge transport layers ETL1, ETL2, and ETL3 may cover the emission layers EL1, EL2, and EL3, respectively.

The second charge transport layers ETL1, ETL2, and ETL3 may include an inorganic material. The second charge transport layers ETL1, ETL2, and ETL3 may protect the emission layers EL1, EL2, and EL3 against external moisture, oxygen, and foreign substances, such as dust particles.

The cathode electrode CE may cover the second charge transport layers ETL1, ETL2, and ETL3. The cathode electrode CE may overlap the plurality of first areas A1 and the second area A2. The cathode electrode CE may be stacked with no interruption (e.g., may be continuously stacked or formed) to act as a common electrode for the first light emitting element LD1, the second light emitting element LD2, and the third light emitting element LD3.

The cathode electrode CE may cover the second charge transport layers ETL1, ETL2, and ETL3. The cathode electrode CE may include a fourth edge part EG4 that protrudes from one of the plurality of first areas A1 toward the second area A2. The fourth edge part EG4 may face a partial region of the inner lateral surface T-SP1 that defines the groove T1 of the sixth insulating layer 60. The fourth edge part EG4 may cover the third edge part EG3 and may have a thickness that decreases with decreasing distance from the bottom surface T-UP1 of the sixth insulating layer 60. A portion of the fourth edge part EG4 may have a wedge shape when viewed in a vertical cross-section. However, the shape of the fourth edge part EG4 may be variously changed without being limited thereto.

The cathode electrode CE that overlaps the first area A1 may cover top surfaces of the second charge transport layers ETL1, ETL2, and ETL3 that overlap the first area A1. The cathode electrode CE that overlaps the second area A2 may include a portion other the fourth edge part EG4, and the portion (e.g., a groove cover part) of the cathode electrode CE may overlap the bottom surface T-UP1 that defines the groove T1 of the sixth insulating layer 60.

The groove cover part of the cathode electrode CE may be disposed along the pixel definition layer PDL. The groove cover part of the cathode electrode CE may have a uniform thickness to cover an exposed top surface of the pixel definition layer PDL. The thickness of the groove cover part of the cathode electrode CE may be less than a depth of the groove T1 in the third direction DR3.

The encapsulation layer 140 may be disposed on the light emitting elements LD1 to LD3. The encapsulation layer 140 may include an inorganic layer, an organic layer, and an inorganic layer that are sequentially stacked. However, the layers included in the encapsulation layer 140 are not limited thereto.

The inorganic layers of the encapsulation layer 140 may protect the light emitting elements LD1 to LD3 against moisture and oxygen, and the organic layer of the encapsulation layer 140 may protect the light emitting elements LD1 to LD3 against foreign substances, such as dust particles. The inorganic layers of the encapsulation layer 140 may include a silicon nitride layer, a silicon oxynitride layer, a silicon oxide layer, a titanium oxide layer, or an aluminum oxide layer. The organic layer of the encapsulation layer 140 may include an acryl-based organic layer, but the present disclosure is not limited thereto.

An input sensor layer ISL may be directly disposed on the encapsulation layer 140. Herein, the phrase "component A is directly disposed on component B" may mean that no adhesion (or adhesive) layer is disposed between component A and component B.

The input sensor layer ISL may obtain information about coordinates of external inputs. The input sensor layer ISL may include a single-layer or multi-layer conductive layer. The input sensor layer ISL may use a capacitance method to detect external inputs. However, an operation method of the input sensor layer ISL is not limited thereto, and the input sensor layer ISL may detect external inputs by using an electromagnetic induction method or an input detection method.

The input sensor layer ISL may include a first sensor insulating layer 210, a first conductive layer 220, a second sensor insulating layer 230, a second conductive layer 240, and a third sensor insulating layer 250. The first sensor insulating layer 210 may be directly disposed on the display panel DP (e.g., may be directly disposed on the encapsulation layer 140). The first sensor insulating layer 210 may include an inorganic layer including at least one selected from silicon nitride, silicon oxynitride, and silicon oxide. Each of the first and second conductive layers 220 and 240 may have a single-layer structure or a multi-layer structure in which layers are stacked on each other along the third direction DR3. The first and second conductive layers 220 and 240 may include conductive lines that define (or form) a mesh-type electrode. The conductive line of the first conductive layer 220 and the conductive line of the second conductive layer 240 may not be connected to each other or may be connected to each other through a contact hole (e.g., a contact opening) that penetrates (or extends through) the second sensor insulating layer 230. A type of a sensor formed by the input sensor layer ISL may determine a connection relationship between the conductive line of the first conductive layer 220 and the conductive line of the second conductive layer 240.

In one embodiment, the first and second conductive layers 220 and 240, each having a single-layer structure, may include a metal layer or a transparent conductive layer. The metal layer may include molybdenum, silver, titanium, copper, aluminum, or any alloy thereof. The transparent conductive layer may include transparent conductive oxide (TCO), such as indium tin oxide (ITO), indium zinc oxide (IZO), zinc oxide (ZnO$_X$), or indium zinc tin oxide (IZTO) Additionally or alternatively, the transparent conductive layer may include a graphene, a metal nano-wire, or a conductive polymer, such as poly(3,4-ethylenedioxythio-phene) (also referred to as PEDOT).

In another embodiment, the first and second conductive layers 220 and 240, each having a multi-layer structure, may include metal layers. The metal layers may include, for example, a tri-layer structure of titanium/aluminum/tita-nium. The multi-layer conductive layer may include at least one metal layer and at least one transparent conductive layer.

The second sensor insulating layer 230 may cover the first conductive layer 220. The second sensor insulating layer 230 may include an inorganic layer including at least one selected from silicon nitride, silicon oxynitride, and silicon oxide. The third sensor insulating layer 250 may cover the second conductive layer 240. The third sensor insulating layer 250 may include an organic layer.

Figure 7:
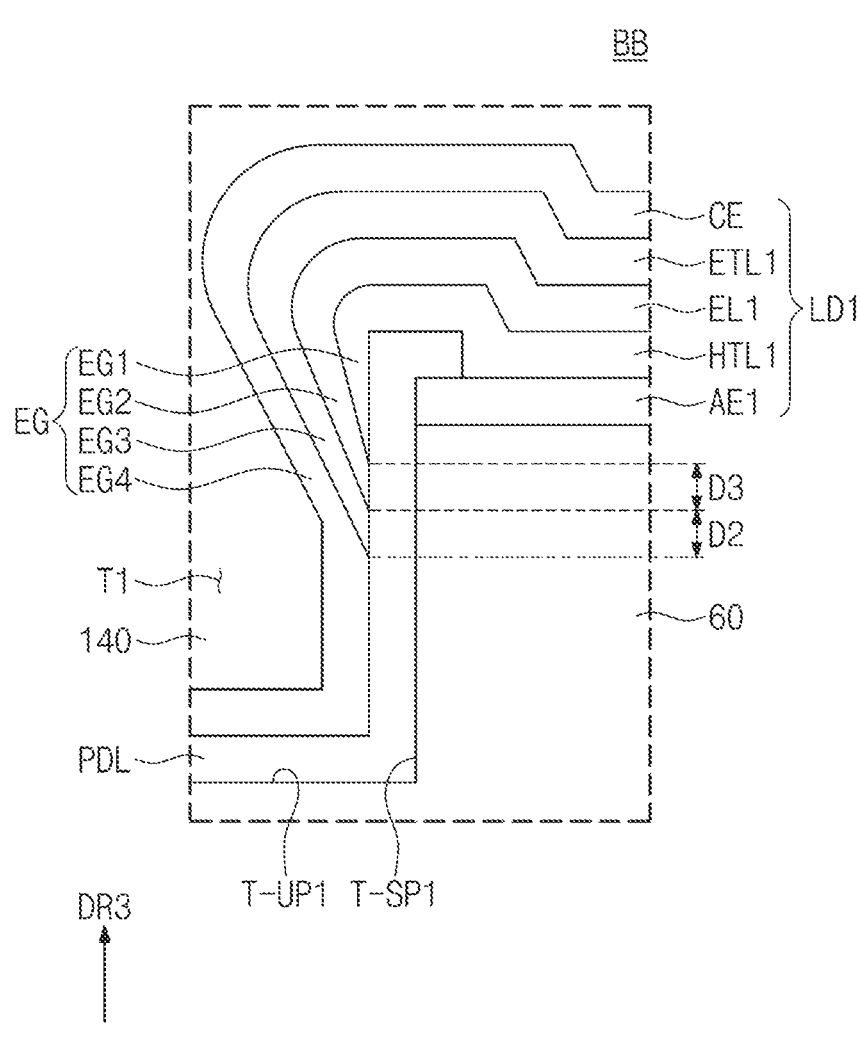
FIG. 7 is an enlarged cross-sectional view of the section BB in FIG. 6.

FIG. 7 is an enlarged cross-sectional view of the section BB in FIG. 6.

Referring to FIG. 7, an edge part EG may have a stack structure. The second edge part EG2 may cover the first edge part EG1, the third edge part EG3 may cover the second edge part EG2, and the fourth edge part EG4 may cover the third edge part EG3.

The second edge part EG2 of the first emission layer EL1 may be closer than the first edge part EG1 of the first hole transport layer HTL1 to the bottom surface T-UP1 of the sixth insulating layer 60. The third edge part EG3 of the first electron transport layer ETL1 may be closer than the second edge part EG2 of the first emission layer EL1 to the bottom surface T-UP1 of the sixth insulating layer 60. The fourth edge part EG4 of the cathode electrode CE may be closer than the third edge part EG3 of the first electron transport layer ETL1 to the bottom surface T-UP1 of the sixth insulating layer 60.

When viewed in a vertical cross-section, a second dis-tance D2 (or a contact distance between the pixel definition layer PDL and the third edge part EG3 of the first electron transport layer ETL1) may be in a range of about 10 nm and about 150 nm. When the second distance D2 is less than about 10 nm, an end of the third edge part EG3 adjacent to the bottom surface T-UP1 may be extremely close to an end of the second edge part EG2 adjacent to the bottom surface T-UP1. Therefore, the third edge part EG3 may not reliably protect the second edge part EG2 or a portion of the first emission layer EL1 against external moisture, oxygen, and foreign substances.

When the second distance D2 is greater than about 150 nm, the third edge part EG3 may have a thickness greater than necessary. In this case, the edge part EG may exces-sively protrude toward the second area A2, and thus, neigh-boring edge parts EG1, EG2, and EG3 may contact each other to induce impact. To avoid this situation when the second distance D2 is greater than about 150 nm, it may therefore be necessary to increase an interval between the light emitting elements LD1 to LD3, resulting in a reduction in resolution.

When viewed in a vertical cross-section, a third distance D3 (or a contact distance between the pixel definition layer PDL and the second edge part EG2 of the first emission layer EL1) may be in a range of about 10 nm and 150 nm. When the third distance D3 is less than about 10 nm, the end of the second edge part EG2 adjacent to the bottom surface T-UP1 may be extremely close to an end of the first edge part EG1 adjacent to the bottom surface T-UP1. Therefore, it may be likely that the first edge part EG1 or a portion of the first hole transport layer HTL1 is in contact with the third edge part EG3 or a portion of the first electron transport layer ETL1. In some embodiments, the third distance D3 may be equal to or greater about 20 nm and equal to or less than about 100 nm.

When the third distance D3 is greater than about 150 nm, the second edge part EG2 may have a thickness greater than necessary. In this case, the edge part EG may excessively protrude toward the second area A2, and thus, neighboring edge parts EG1, EG2, and EG3 may contact each other to induce impact. To avoid this situation when the third dis-tance D3 is greater than about 150 nm, it may therefore be necessary to increase an interval between the light emitting elements LD1 to LD3, resulting in a reduction in resolution.

Figure 8:
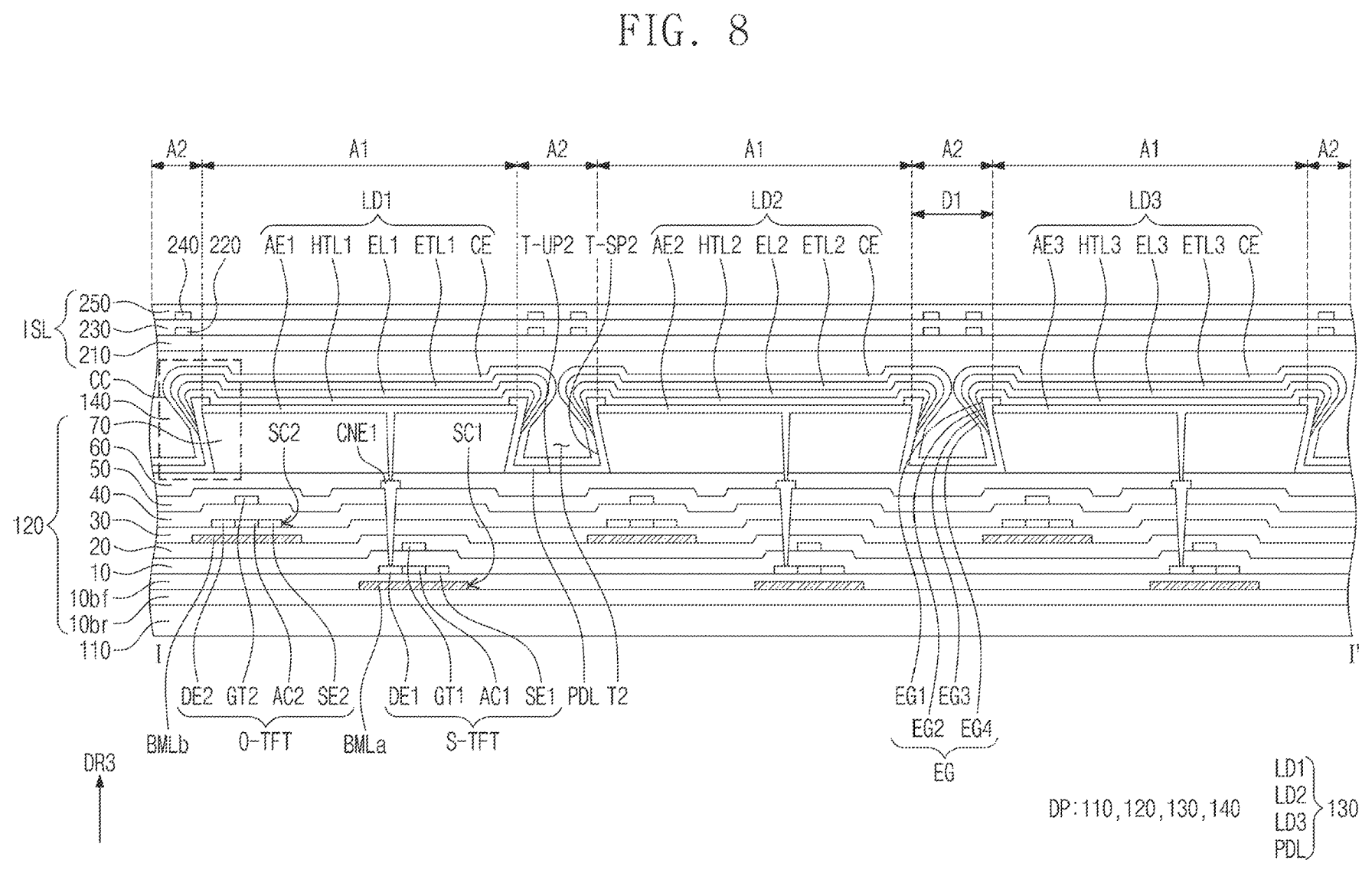

FIG. 8 is a cross-sectional view taken along the line I-I' of FIG. 3 according to another embodiment.

Referring to FIG. 8, a display device (see, e.g., DD in FIG. 2) according to the present embodiment may be configured identically to that discussed with respect to FIG. 6 except for a sixth insulating layer 60, a seventh insulating layer 70, and a hole T2. Therefore, repeated description of features and elements that are the same or substantially similar to that described above with respect to FIG. 6 may be omitted to avoid a repetitive description.

The sixth insulating layer 60 (e.g., a first organic layer) may be disposed on the fifth insulating layer 50. The sixth insulating layer 60 may provide a flat (or planar) top surface that covers (or alleviates) a step difference of the fifth insulating layer 50. The seventh insulating layer 70 (e.g., a second organic layer) may be disposed on the sixth insulat-ing layer 60.

The sixth insulating layer 60 and the seventh insulating layer 70 may each be an organic layer including an organic material. For example, the sixth insulating layer 60 and the seventh insulating layer 70 may include a general universal polymer, such as benzocyclobutene (BCB), a polyimide, hexamethyldisiloxane (HMDSO), polymethylmethacrylate (PMMA), and polystyrene (PS), a polymer derivative having a phenol group, an acryl-based polymer, an imide-based polymer, an aryl ether-based polymer, an amide-based poly-mer, a fluoride-based polymer, a p-xylene-based polymer, a vinyl alcohol-based polymer, or any blend thereof.

The seventh insulating layer 70 may have a hole (e.g., an opening) T2 that is defined to correspond to the second area A2. The hole T2 may penetrate (or may extend through) the seventh insulating layer 70 to expose a top surface T-UP2 of the sixth insulating layer 60. The hole T2 may be defined by an inner lateral surface T-SP2 of the seventh insulating layer 70 and the top surface T-UP2 of the sixth insulating layer 60. When viewed in a plan view, the hole T2 may surround the first anode electrode AE1, the second anode electrode AE2, and the third anode electrode AE3 (see, e.g., FIG. 3). In this description, the hole T2 shown in FIG. 8 may correspond to the groove T1 shown in FIG. 6. The inner lateral surface T-SP2 of the seventh insulating layer 70 and the top surface T-UP2 of the sixth insulating layer 60 depicted in FIG. 8 may correspond to the inner lateral surface T-SP1 and the bottom surface T-UP1 of the sixth insulating layer 60 depicted in FIG. 6.

A width of the hole T2 may increase with decreasing distance from the base substrate 110 along a direction opposite to the third direction DR3. Therefore, when viewed in a vertical cross-section, the seventh insulating layer 70 may have an inverse trapezoidal shape in which a top side is longer than a bottom side. A minimum (or smallest) width of the hole T2 may be equal to or less than about 2 μm. When the minimum width of the hole T2 is greater than about 2 μm, an interval between the light emitting elements LD1 to LD3 may be increased, causing a reduction in resolution.

Each of the first to third anode electrodes AE1 to AE3 may be disposed on the seventh insulating layer 70.

Figure 9:
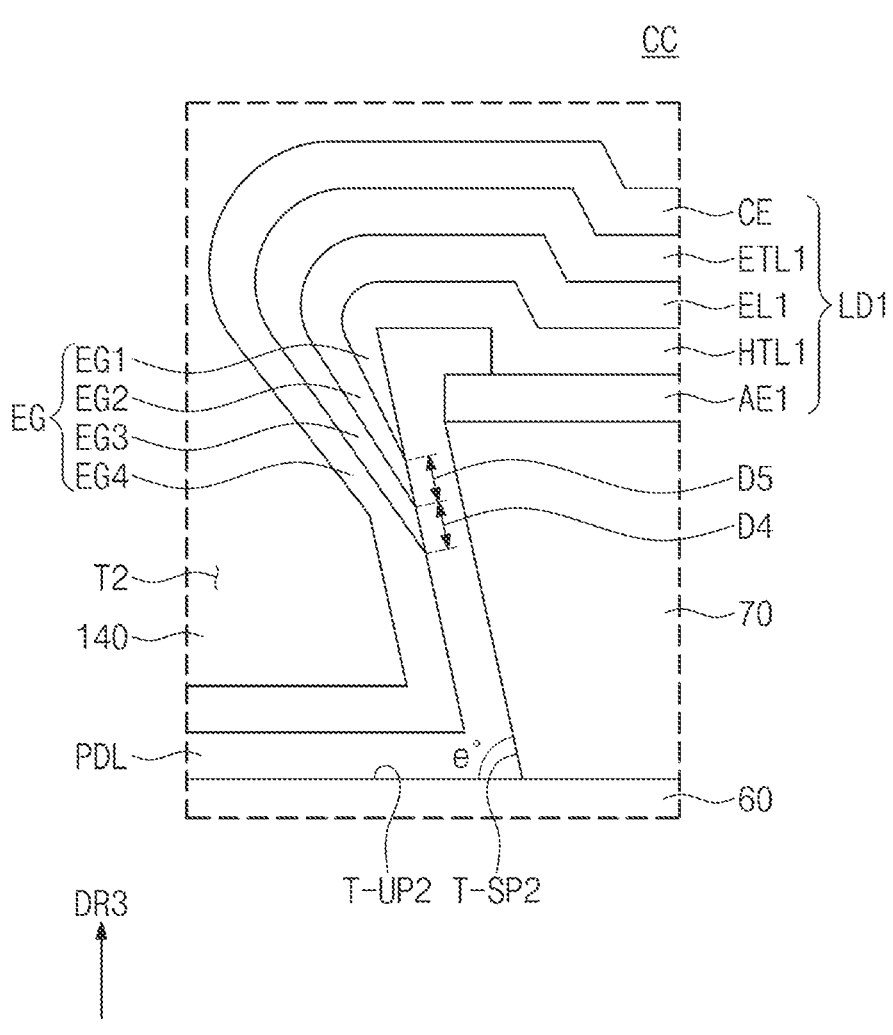
FIG. 9 is an enlarged cross-sectional view of the section CC in FIG. 8.

FIG. 9 is an enlarged cross-sectional view of the section CC in FIG. 8.

Referring to FIG. 9, an angle e° (e.g., a first angle) equal to or greater than about 80° may be formed between the inner lateral surface T-SP2 of the seventh insulating layer 70 and the top surface T-UP2 of the sixth insulating layer 60, which together define the hole T2. When the first angle e° is less than about 80°, the inner lateral surface T-SP2 of the seventh insulating layer 70 may become excessively recessed toward a central portion of the seventh insulating layer 70 as the inner lateral surface T-SP2 of the seventh insulating layer 70 becomes more adjacent to (or nears) the sixth insulating layer 60 along a direction opposite to the third direction DR3. In this case, the edge part EG may not be deposited on an inner lateral surface of the pixel definition layer PDL, which corresponds to the inner lateral surface T-SP2 of the seventh insulating layer 70.

As shown in FIG. 9, when the inner lateral surface T-SP2 of the seventh insulating layer 70 is formed inclined (e.g., inclined with respect to the third direction DR3), when viewed in a vertical cross-section, a fifth distance D5 (or a contact distance between the second edge part EG2 and the pixel definition layer PDL) and a fourth distance D4 (or a contact distance between the third edge part EG3 and the pixel definition layer PDL) may both increase. For example, the fourth distance D4 shown in FIG. 9 may be greater than the second distance D2 shown in FIG. 7, and the fifth distance D5 shown in FIG. 9 may be greater than the third distance D3 shown in FIG. 7. Therefore, the second edge part EG2 may have a relatively large length that covers the first edge part EG1, and the third edge part EG3 may have a relatively large length that covers the second edge part EG2.

Figure 10:
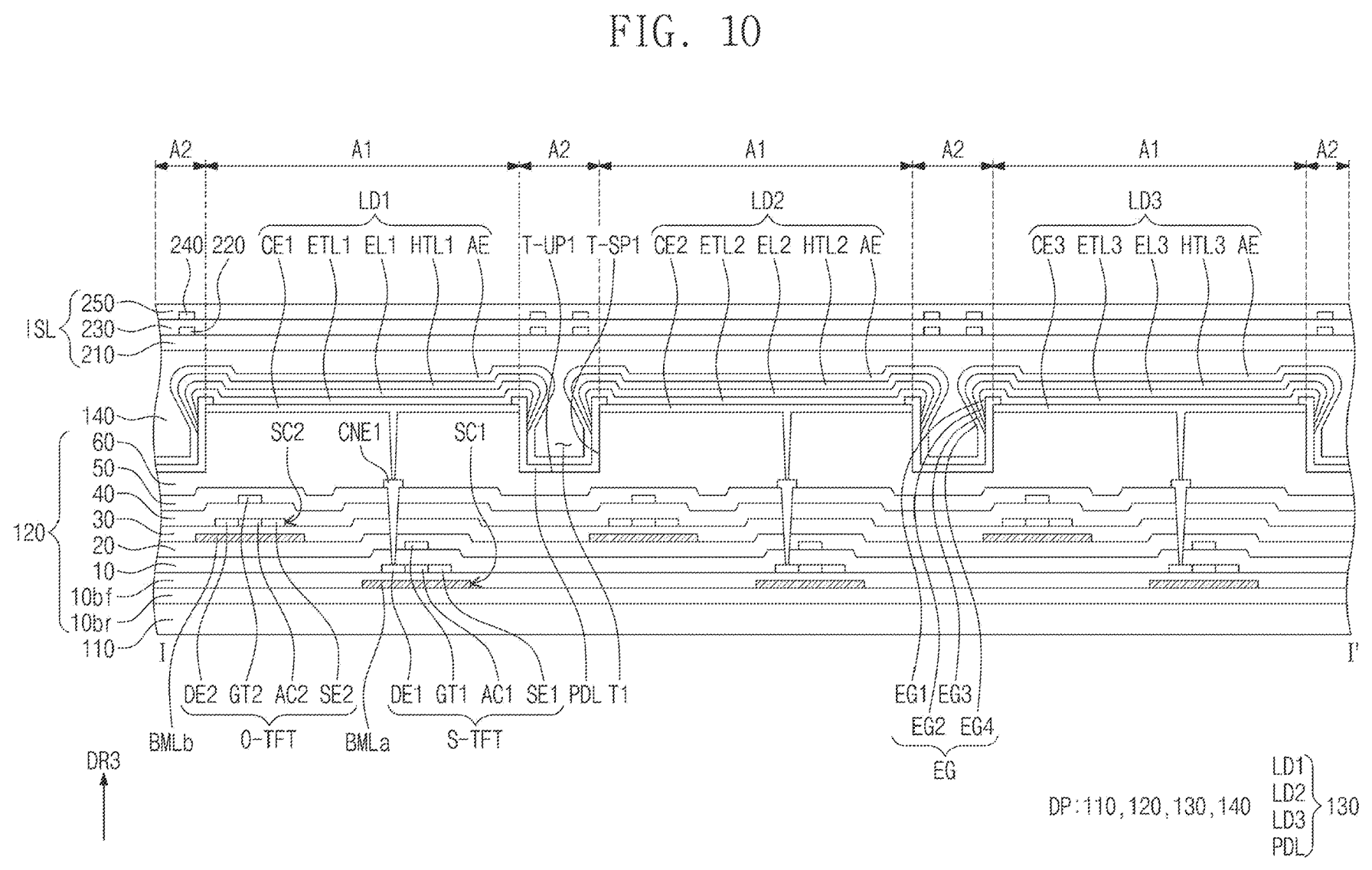

FIG. 10 is a cross-sectional view taken along the line I-I' of FIG. 3 according to another embodiment.

Referring to FIG. 10, a display device (see, e.g., DD in FIG. 2) according to the present embodiment may be the same as the display device described with respect to FIG. 6 except for the stack sequence of the light emitting elements LD1 to LD3. The same reference numerals are allocated to the same elements described with respect to the embodiment shown in FIG. 6, and a repeat description of the same components will be omitted.

The first to third light emitting elements LD1 to LD3 may be disposed on the sixth insulating layer 60. The first light emitting element LD1 may include a first cathode electrode CE1, a first electron transport layer ETL1, a first emission layer EL1, a first hole transport layer HTL1, and an anode electrode AE that are sequentially stacked. The second light emitting element LD2 may include a second cathode electrode CE2, a second electron transport layer ETL2, a second emission layer EL2, a second hole transport layer HTL2, and an anode electrode AE that are sequentially stacked. The third light emitting element LD3 may include a third cathode electrode CE3, a third electron transport layer ETL3, a third emission layer EL3, a third hole transport layer HTL3, and an anode electrode AE that are sequentially stacked.

The stack sequence of the light emitting elements LD1 to LD3 shown in FIG. may be opposite to that of the light emitting elements LD1 to LD3 shown in FIG. 6. The first to third cathode electrodes CE1 to CE3 of the first to third light emitting elements LD1 to LD3 shown in FIG. 10 may correspond to the first to third anode electrodes AE1 to AE3 of the first to third light emitting elements LD1 to LD3 shown in in FIG. 6. The first to third electron transport layers ETL1 to ETL3 shown in FIG. 10 may correspond to the first to third hole transport layers HTL1 to HTL3 shown in FIG. 6. The first to third hole transport layers HTL1 to HTL3 shown in FIG. 10 may correspond to the first to third electron transport layers ETL1 to ETL3 shown in FIG. 6. The anode electrode AE shown in FIG. 10 may correspond to the cathode electrode CE shown in FIG. 6.

The stack sequence of the light emitting elements LD1 to LD3 shown in FIG. 10 may cause the first to third emission layers EL1 to EL3 to have their top (or upper) surfaces covered with the first to third hole transport layers HTL1 to HTL3, respectively. Because the first to third hole transport layers HTL1 to HTL3 are thicker than the first to third electron transport layers ELT1 to ELT3, the first to third hole transport layers HTL1 to HTL3 may better protect the first to third emission layers EL1 to EL3.

Figure 11:
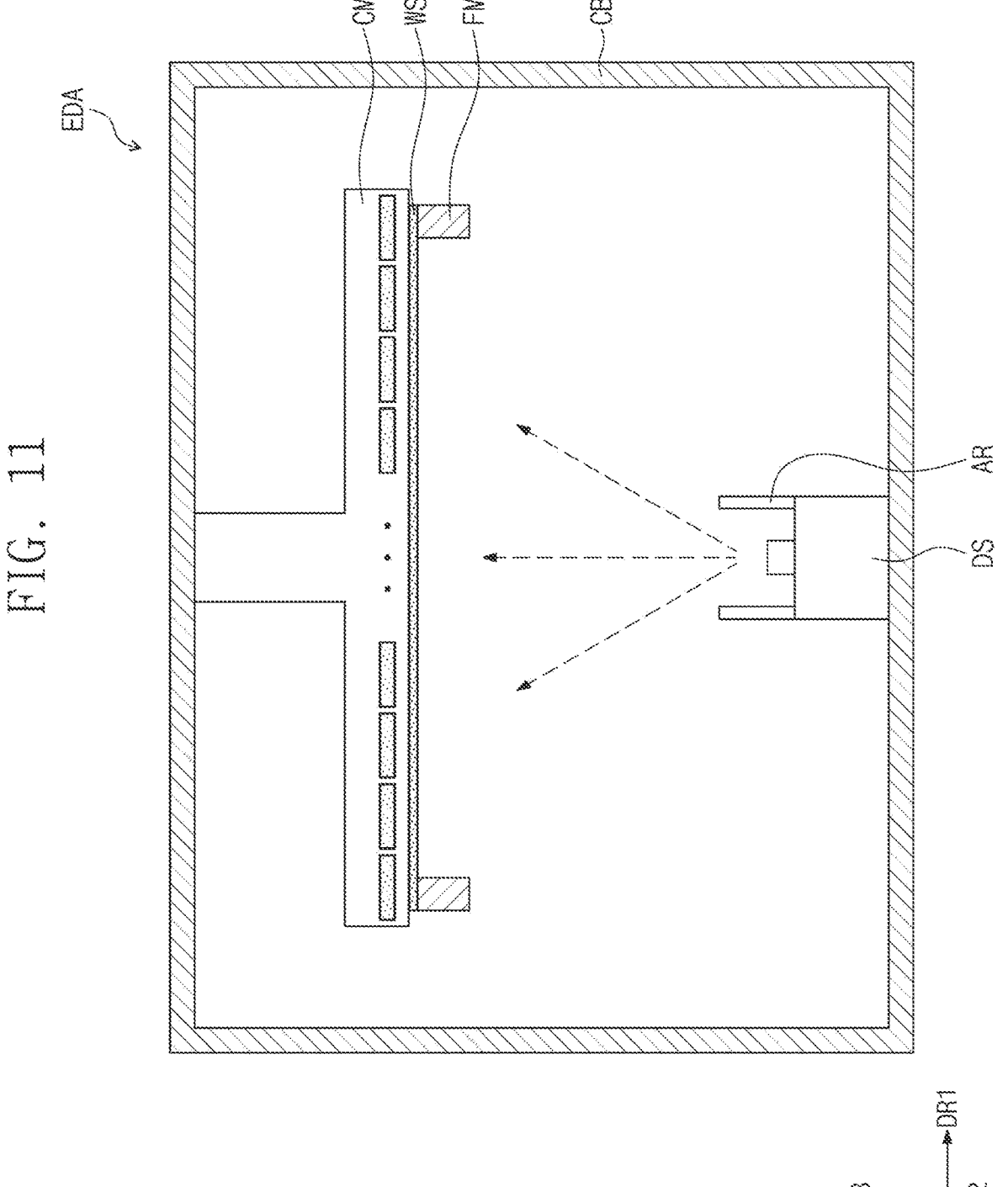
FIG. 11 is a cross-sectional view of a deposition apparatus according to an embodiment of the present disclosure.

FIG. 11 is a cross-sectional view of a deposition apparatus EDA according to an embodiment of the present disclosure.

Referring to FIG. 11, the deposition apparatus EDA according to an embodiment of the present disclosure may include a deposition chamber CB and a fixing member CM, a deposition source DS, and a frame FM that are disposed inside the deposition chamber CB. The deposition apparatus EDA may further include one or more additional machines for providing an in-line system.

A vacuum may be established as a deposition condition in the deposition chamber CB. The deposition chamber CB may have a bottom surface, a ceiling surface, and sidewalls. The bottom surface of the deposition chamber CB may be parallel to a plane defined by the first direction DR1 and the second direction DR2. The third direction DR3 may be a normal direction relative to the bottom surface of the deposition chamber CB.

The fixing member CM may be provided in the deposition chamber CB to be aligned above (e.g., to lie on) the deposition source DS and to fix a work substrate WS thereto. The fixing member CM may be installed on the ceiling surface of the deposition chamber CB.

The deposition source DS may evaporate a deposition material, such as a light emitting material, to inject (or emit) the evaporated deposition material as a deposition vapor. The deposition vapor may be deposited on the work substrate WS. The work substrate WS may be defined to indicate a substrate in the middle of process for fabricating the display panel DP. The frame FM may be disposed adjacent to an outer side of the work substrate WS, such that the frame FM may fix the work substrate WS. Although FIG. 11 depicts one deposition source DS, the present disclosure is not limited thereto, and the deposition apparatus EDA may include a plurality of deposition sources DS.

The deposition source DS may be provided with an angle regulator AR to adjust a deposition angle. The angle regulator AR may be a shield (e.g., a shield layer) that blocks injection of the deposition material that is injected (or emitted) at a certain angle. The angle regulator AR is illustrated as a shield attached to one side of the deposition source DS, but the present disclosure is not limited thereto and the angle regulator AR may have any suitable shape for adjusting the deposition angle.

The deposition apparatus EDA, according to an embodiment of the present disclosure, may be configured such that a deposition process is performed by using (or controlling) the deposition angle without a mask. These will be discussed below.

FIGS. 12 to 27 are cross-sectional views showing steps of a method of fabricating a display device (see, e.g., DD in FIG. 2) according to an embodiment of the present disclosure.

Figures 12, 13:
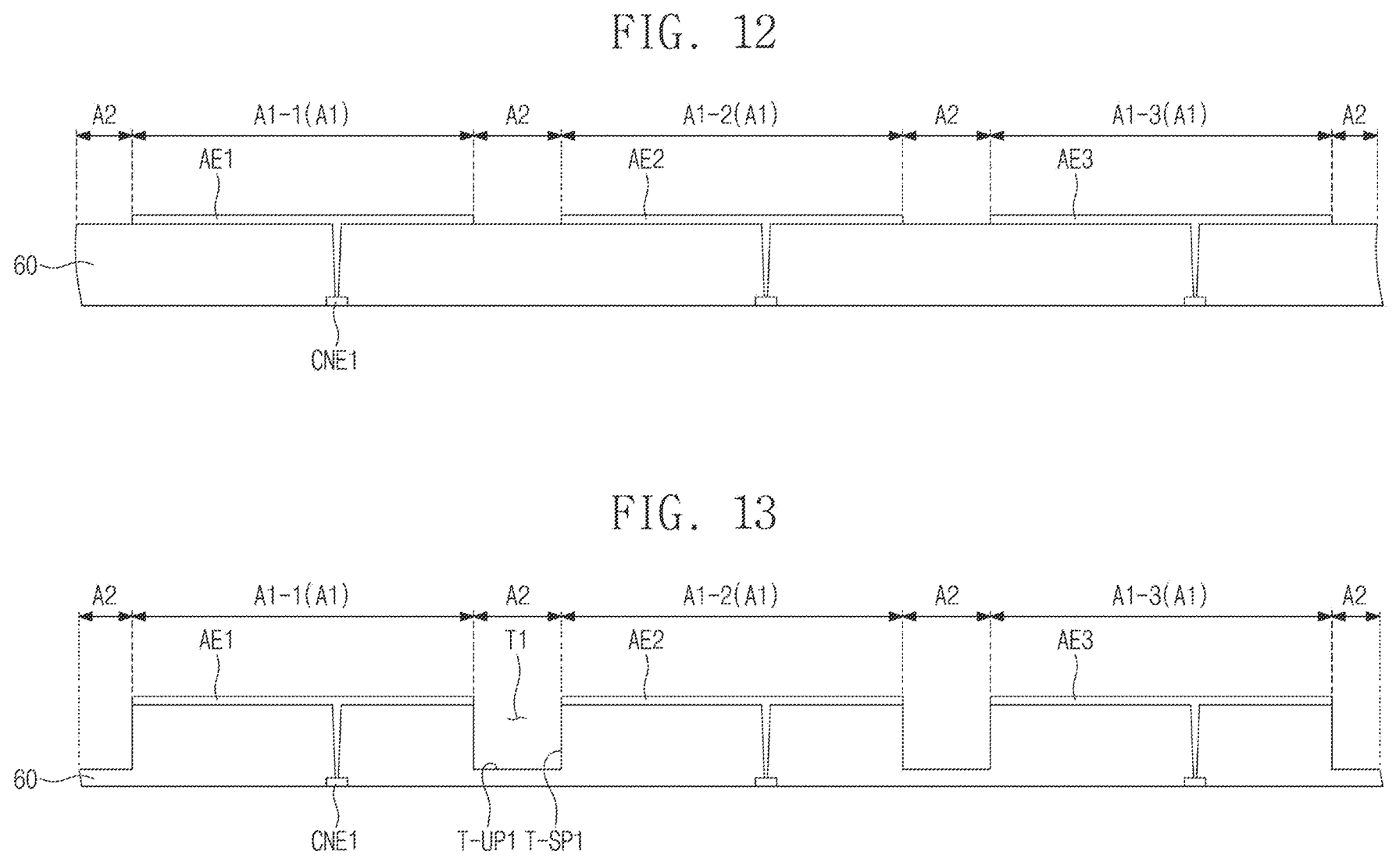

Referring to FIG. 12, a sixth insulating layer 60 (e.g., an organic layer) may be formed on a base substrate (see, e.g., 110 in FIG. 6) that has a plurality of first areas A1 and a second area A2 disposed adjacent to the plurality of first areas A1. FIG. 12 omits illustration of a plurality of layers disposed below the sixth insulating layer 60 for clarity.

First to third anode electrodes AE1 to AE3 may be formed on the sixth insulating layer 60 to respectively correspond to the plurality of first areas A1. Each of the first to third anode electrodes AE1 to AE3 may be connected through a contact hole (e.g., a contact opening) that penetrates (or extends through) the sixth insulating layer 60 to a corresponding one of first connection electrodes CNE1.

Referring to FIG. 13, a groove T1 may be formed in the sixth insulating layer 60 to correspond to the second area A2. The groove T1 may be defined by an inner lateral surface T-SP1 and a bottom surface T-UP1 of the sixth insulating layer 60. The groove T1 may be formed through a wet etching process or a dry etching process.

Figure 14:
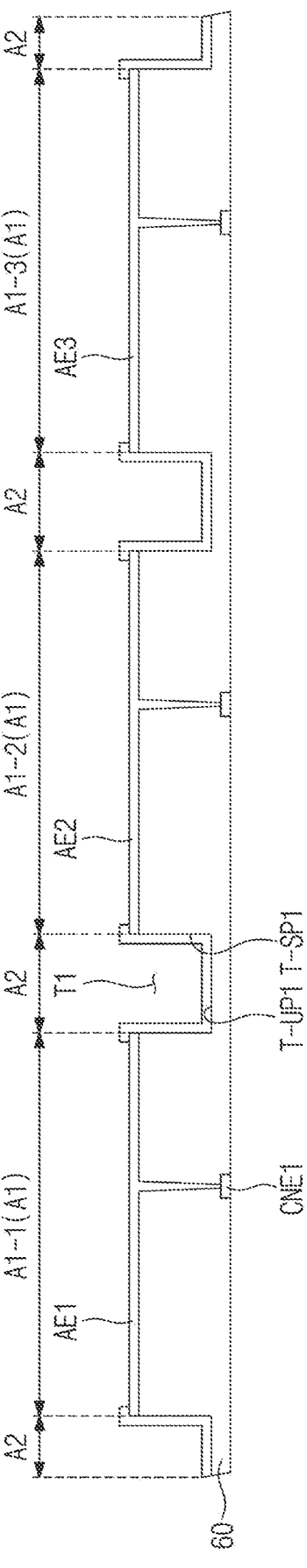

Referring to FIG. 14, a pixel definition layer PDL may be formed to cover the inner lateral surface T-SP1 that defines the groove T1 in the sixth insulating layer 60 and to also cover an edge of each of the first to third anode electrodes AE1 to AE3.

Figure 15A:
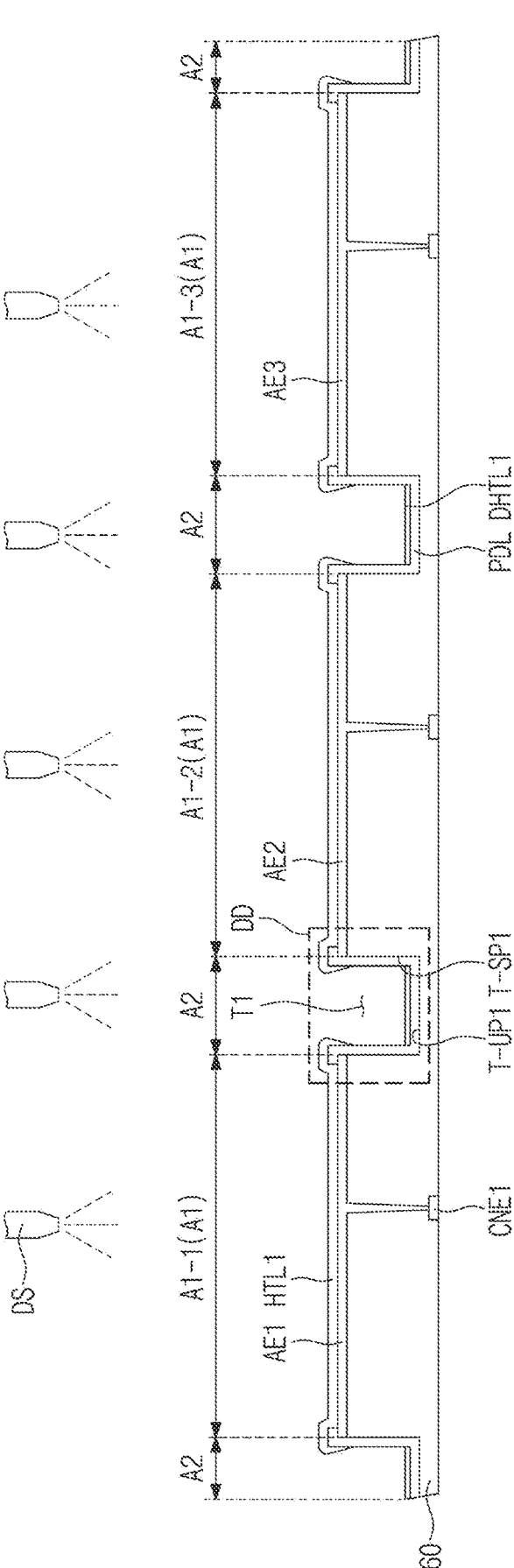

Referring to FIG. 15A, a first deposition material may be injected from a deposition source DS to form a first hole transport layer HTL1 on each of the first to third anode electrodes AE1 to AE3. In this step, a first dummy hole transport layer DHTL1 (or a first charge dummy transport layer) may also be formed to overlap the second area A2. The first hole transport layer HTL1 may have a first edge part EG1 that faces a partial region of the inner lateral surface T-SP1 that defines the groove T1 in the sixth insulating layer 60.

Figure 15B:
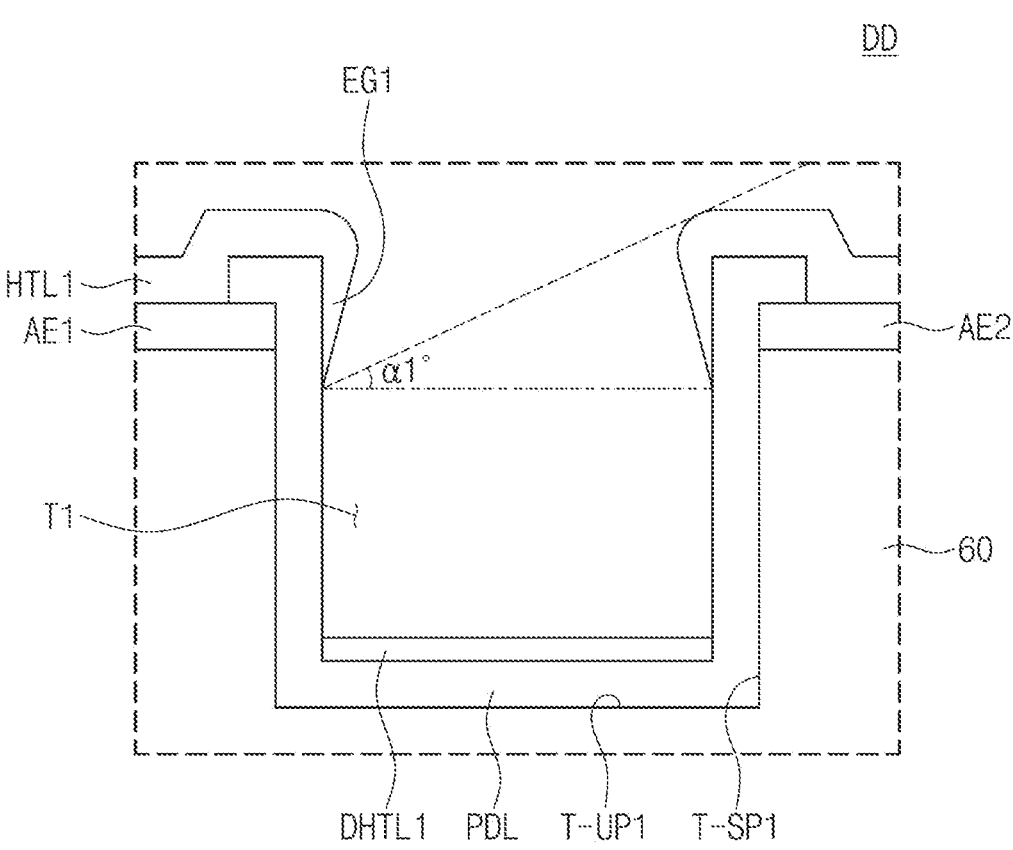

FIG. 15B is an enlarged view showing the section DD in FIG. 15A. Referring to FIG. 15B, the first deposition material may be injected at a first incidence angle $\alpha1°$ to form the first edge part EG1. The first incidence angle $\alpha1°$ may be an angle between a horizontal plane and an incident path of the first deposition material. Because the first incidence angle $\alpha1°$ is restricted (by, for example, the angle regulator AR), a path along which the first deposition material is introduced into the groove T1 may be limited (or restricted) without being blocked by the first edge part EG1. The first incidence angle $\alpha1°$ may be equal to or greater than about 50° and equal to or less than about 70°.

Figure 16A:
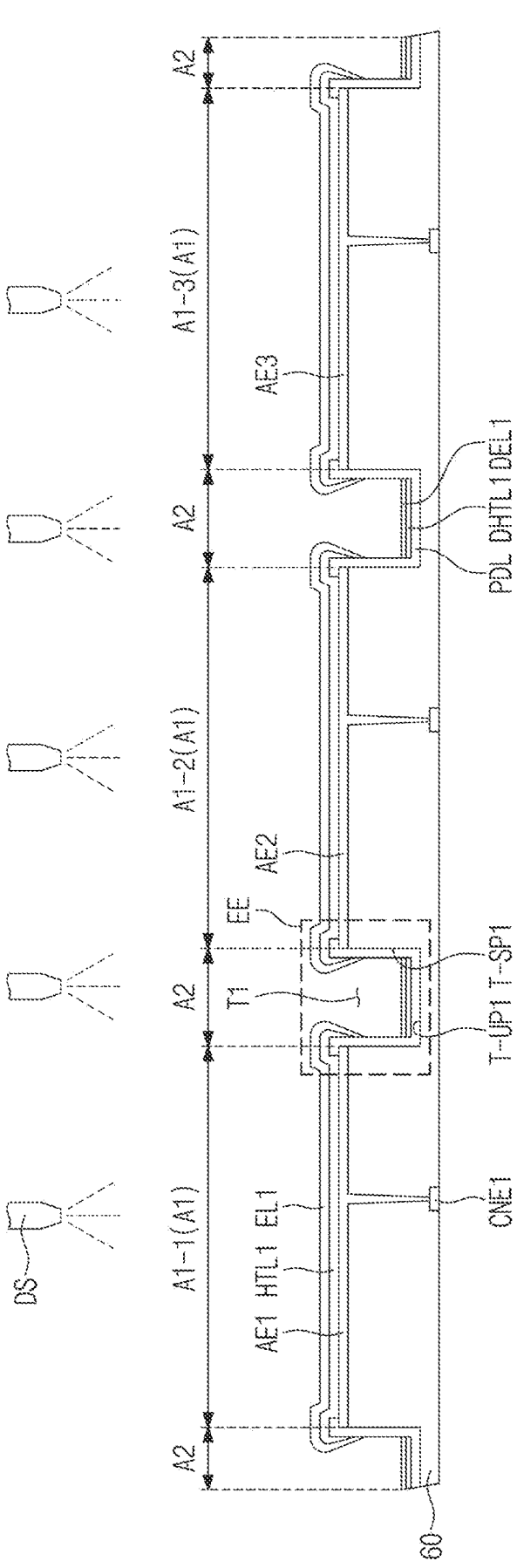

Referring to FIG. 16A, a second deposition material may be injected from the deposition source DS to form a first emission layer EL1 on the first hole transport layer HTL1. The first emission layer EL1 may cover the first hole transport layer HTL1. In this step, a first dummy emission layer DEL1 may also be formed on a first dummy hole transport layer DHTL1 that overlaps the second area A2. The first emission layer EL1 may include a second edge part (seek, e.g., EG2 in FIG. 16B) that faces a partial region of the inner lateral surface T-SP1 that defines the groove T1 in the sixth insulating layer 60.

Figure 16B:
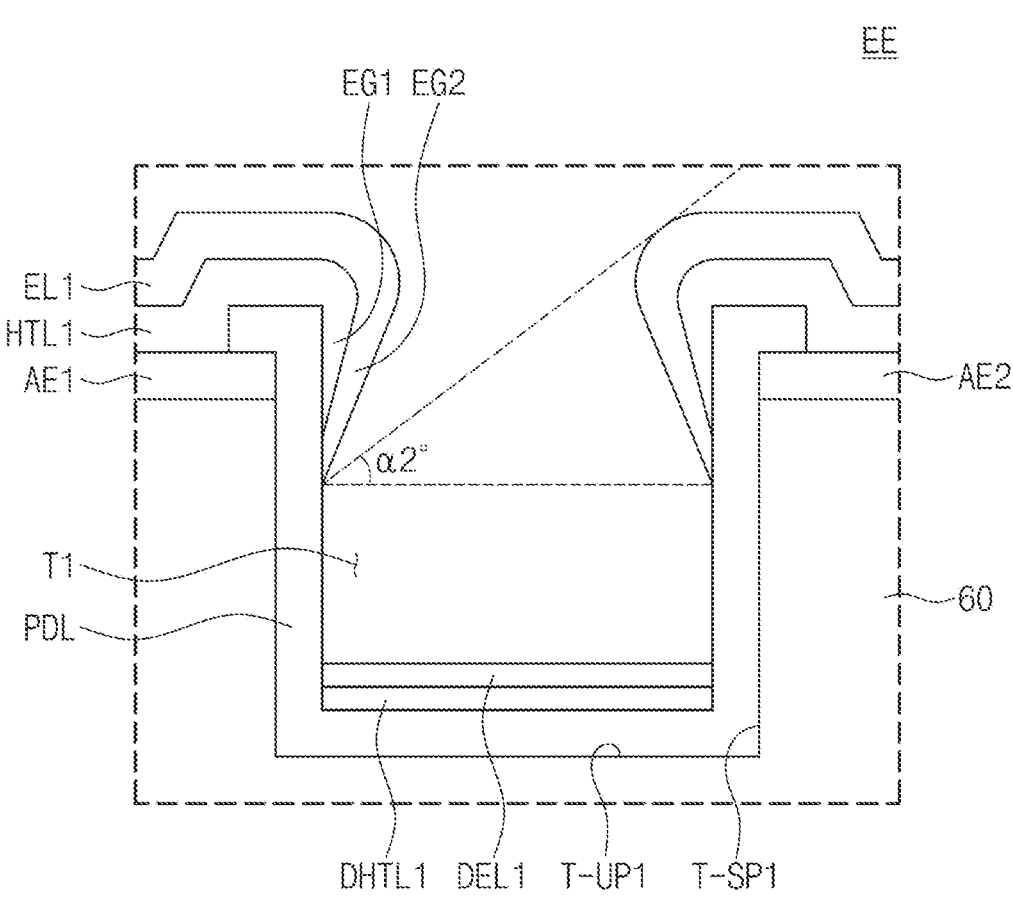

FIG. 16B is an enlarged view of the section EE in FIG. 16A. Referring to FIG. 16B, the second deposition material may be injected at a second incidence angle $\alpha2°$ to form the second edge part EG2. The second incidence angle $\alpha2°$ may be an angle between a horizontal plane and an incident path of the second deposition material. Because the second incidence angle $\alpha2°$ is restricted, a path along which the second deposition material is introduced into the groove T1 may be limited without being blocked by the second edge part EG2. The second incidence angle $\alpha2°$ may be greater than the first incidence angle $\alpha1°$, and therefore, the second deposition material may be deposited on a location that is closer to the bottom surface T-UP1 than an end of the first edge part EG1. The second incidence angle $\alpha2°$ may be equal to or greater than about 60° and equal to or less than about 80°.

Figure 17A:
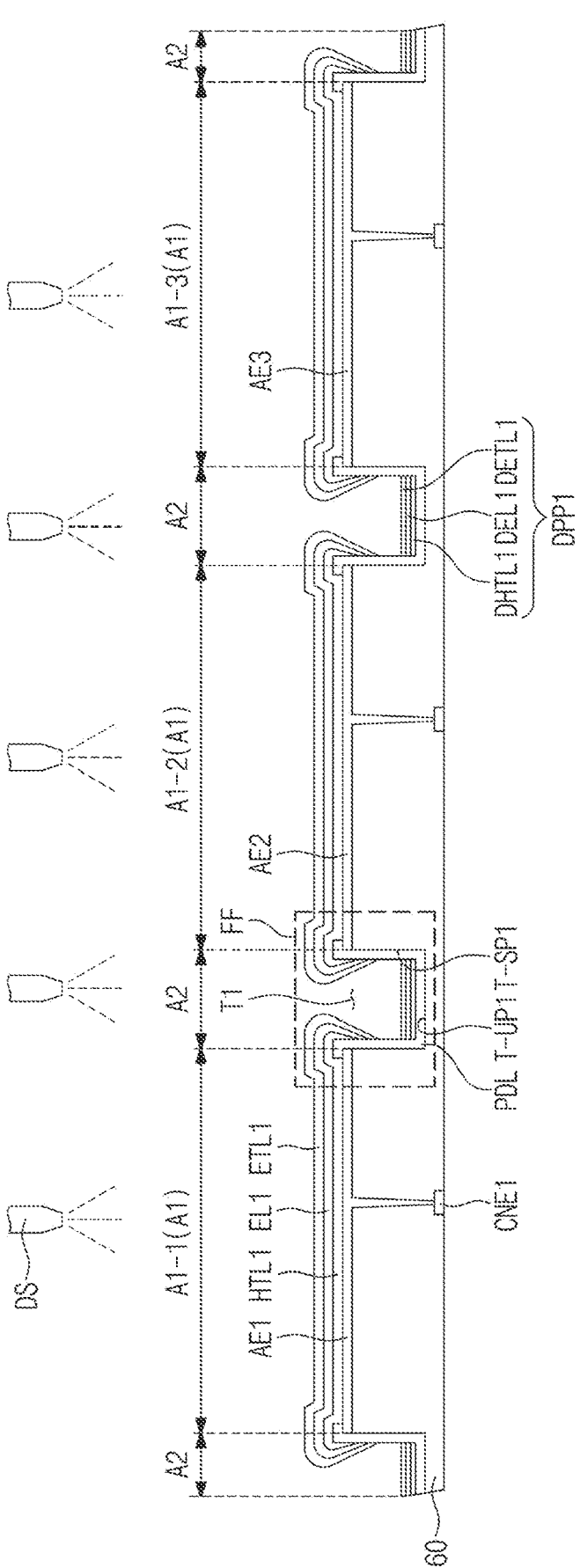

Referring to FIG. 17A, a third deposition material may be injected from the deposition source DS to form a first electron transport layer ETL1 on the first emission layer EL1. The first electron transport layer ETL1 may cover the first emission layer EL1. The third deposition material may include an inorganic material. In this step, a first dummy electron transport layer DETL1 may also be formed on the first dummy emission layer DEL1 that overlaps the second area A2. The first electron transport layer ETL1 may include a third edge part (see, e.g., EG3 in FIG. 17B) that faces a partial region of the inner lateral surface T-SP1 that defines the groove T1 in the sixth insulating layer 60.

Figure 17B:
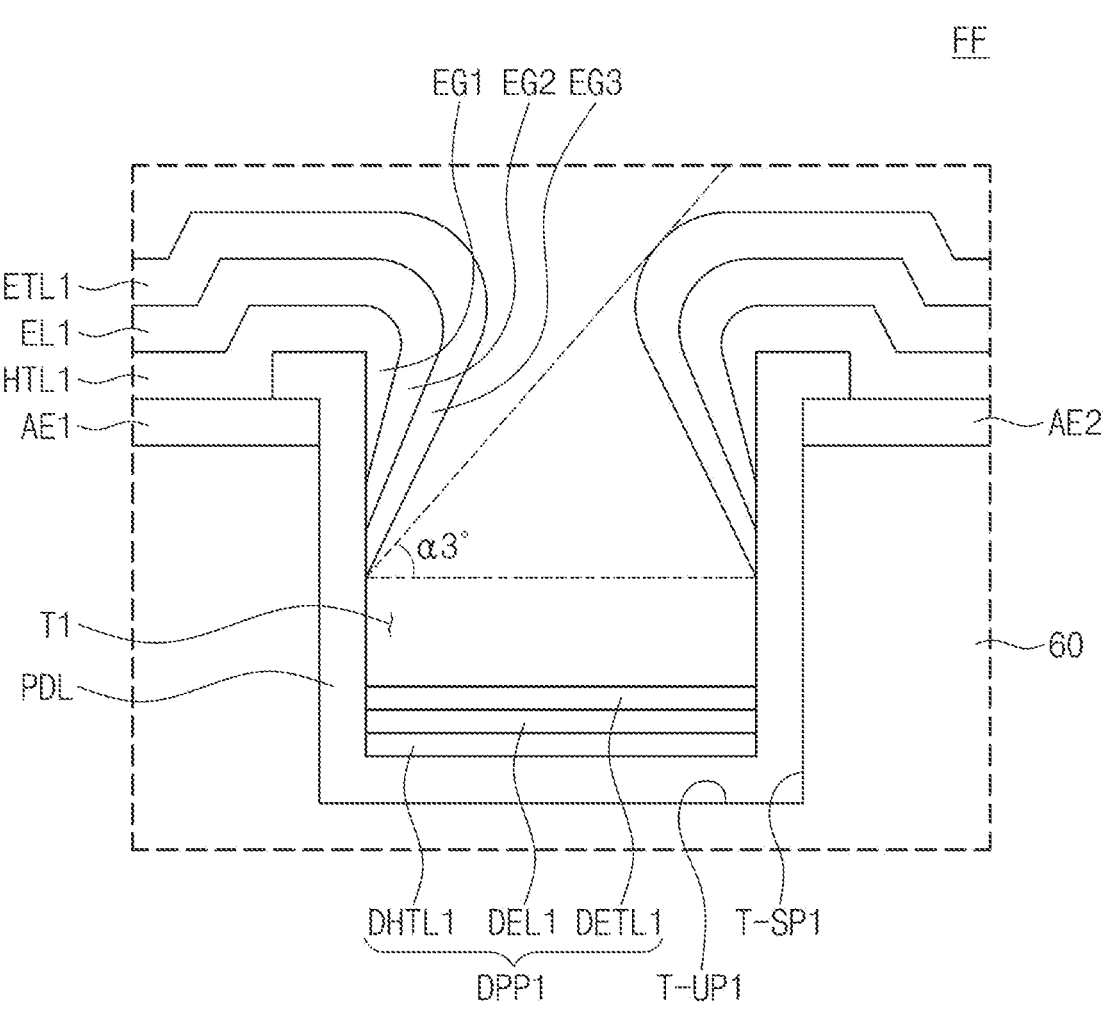

FIG. 17B is an enlarged view of the section FF in FIG. 17A. Referring to FIG. 17B, the third deposition material may be injected at a third incidence angle $\alpha3°$ to form the third edge part EG3. The third incidence angle $\alpha3°$ may be an angle between a horizontal plane and an incident path of the third deposition material. Because the third incidence angle $\alpha3°$ is restricted, a path along which the third deposition material is introduced into the groove T1 may be a limited without being blocked by the third edge part EG3. The third incidence angle $\alpha3°$ may be greater than the second incidence angle $\alpha2°$, and therefore, the third deposition material may be deposited on a location that is closer to the bottom surface T-UP1 than an end of the second edge part EG2. The third incidence angle $\alpha3°$ may be equal to or greater than about 70° and less than about 90°.

Figure 18:
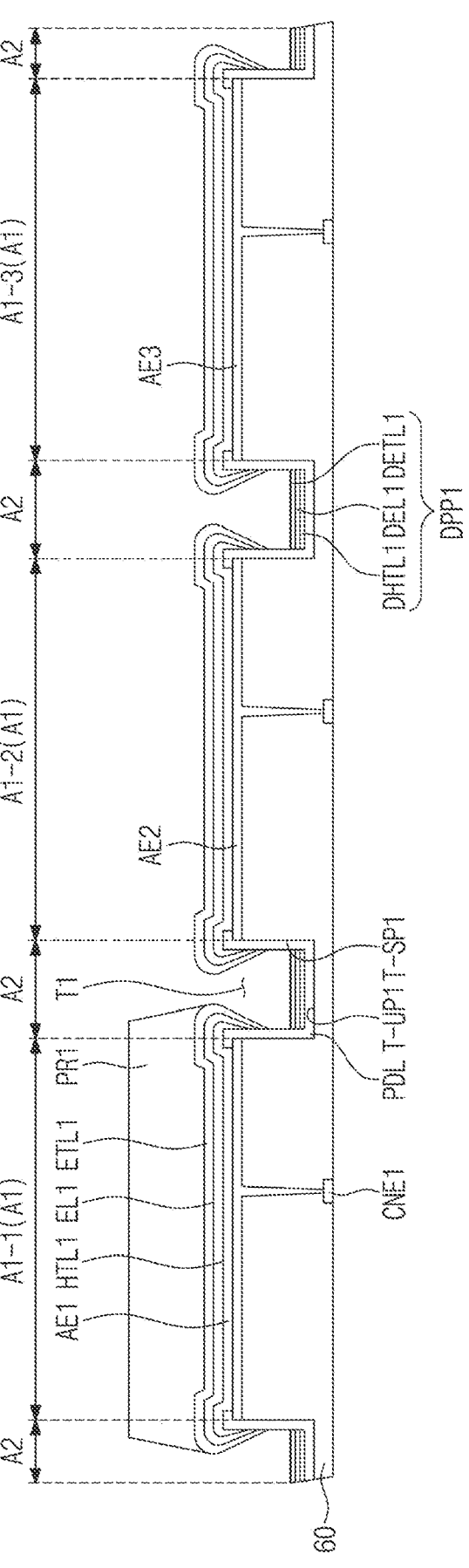

Referring to FIG. 18, a first mask pattern PR1 may be formed to overlap a first color area A1-1 of the plurality of first areas A1. The first mask pattern PR1 may expose the first dummy electron transport layer DETL1 while covering a top surface of the first electron transport layer ETL1 that overlaps the first color area A1-1.

Figure 19:
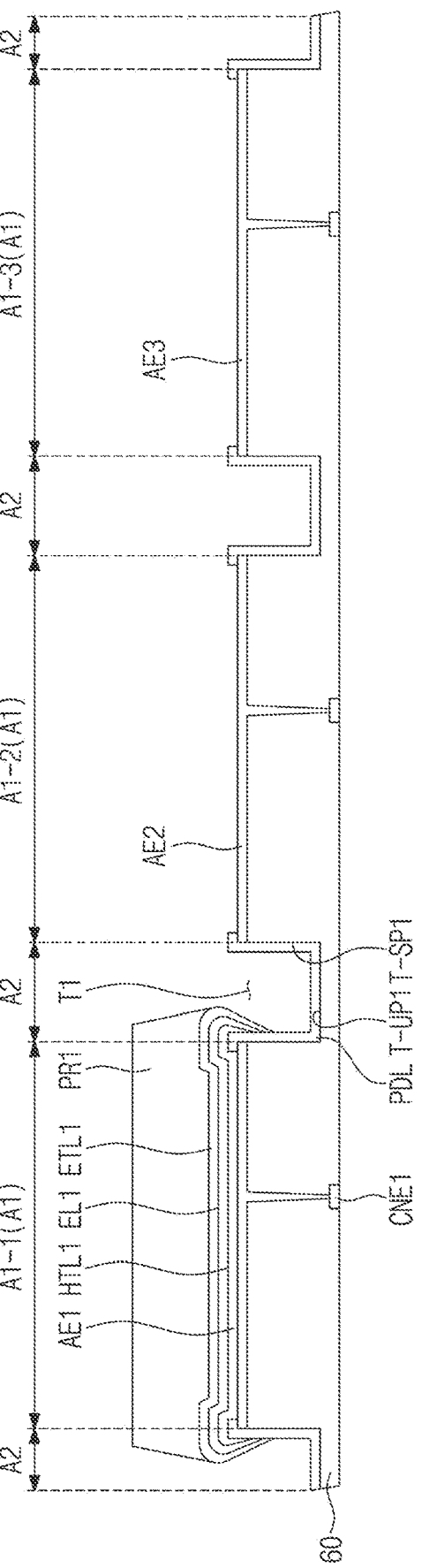

Referring to FIG. 19, a first dummy pattern DPP1, which includes the first dummy hole transport layer DHTL1, the first dummy emission layer DEL1, and the first dummy electron transport layer DETL1 that overlap the second area A2, may be removed. This removal step may be achieved by a dry etching process, such as a plasma etching process. However, this removal step is not limited to the dry etching process, and various suitable processes may be used to accomplish this removal step.

Through the series of processes (or steps) described with respect to FIGS. 15A to 19, the sixth insulating layer 60 may be provided thereon with a first stack that includes the first mask pattern PR1 and a first emission structure HTL1, EL1, and ETL1 that overlaps the first color area A1-1 from among the plurality of first areas A1.

Figure 20:
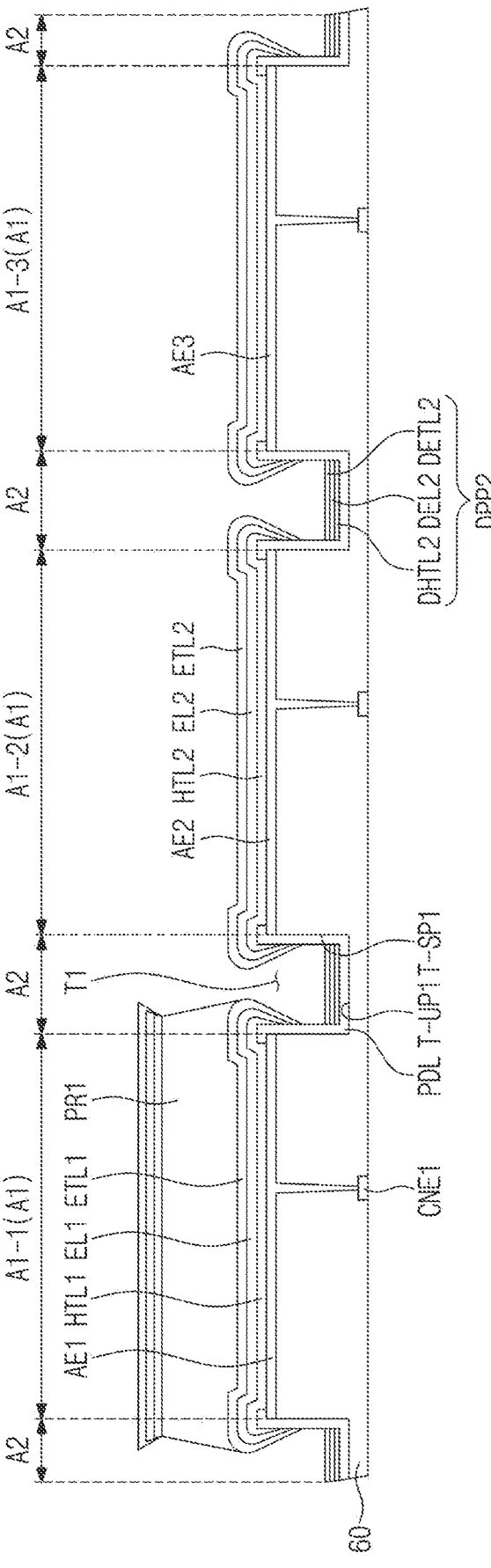

Referring to FIG. 20, the same method (see, e.g., FIGS. 15A to 17B) used for forming the first emission structure HTL1, EL1, and ETL1 may be employed to form a second hole transport layer HTL2, a second emission layer EL2, and a second electron transport layer ETL2. These steps may also form a second dummy hole transport layer DHTL2, a second dummy emission layer DEL2, and a second dummy electron transport layer DETL2 that overlap the second area A2.

Figure 21:
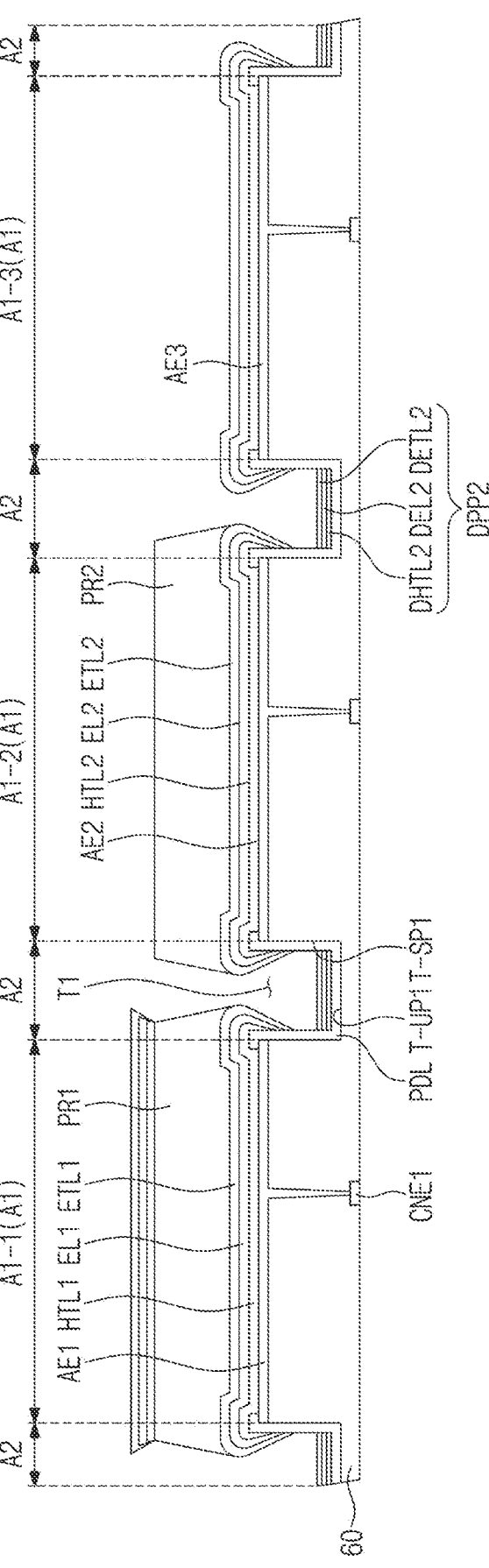

Referring to FIG. 21, a second mask pattern PR2 may be formed to overlap a second color area A1-2 from among the plurality of first areas A1. The second mask pattern PR2 may expose the second dummy electron transport layer DETL2 while covering a top surface of the second electron transport layer ETL2 that overlaps the second color area A1-2.

Figure 22:
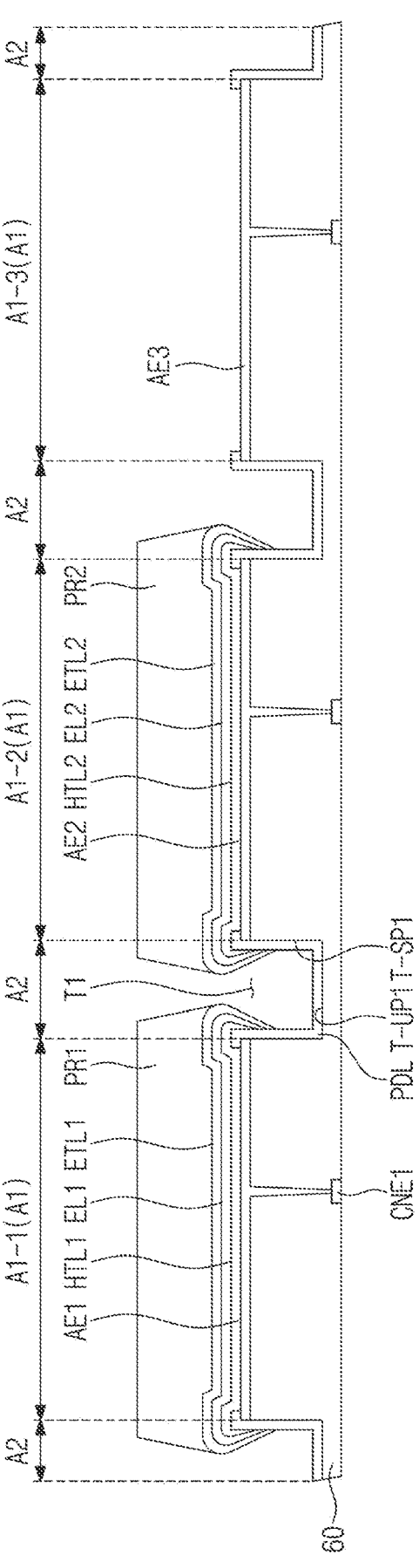

Referring to FIG. 22, a second dummy pattern DPP2, which includes the second dummy hole transport layer DHTL2, the second dummy emission layer DEL2, and the second dummy electron transport layer DETL2 that overlap the second area A2, may be removed. This removal step may be achieved by a dry etching process, such as a plasma etching process. However, this removal step is not limited to the dry etching process, and various suitable processes may be used to accomplish this removal step.

Through the series of processes (or steps) described with respect to FIGS. 20 to 22, the sixth insulating layer 60 may be provided thereon with a second stack that includes the second mask pattern PR2 and a second emission structure HTL2, EL2, and ETL2 that overlaps the second color area A1-2 from among the plurality of first areas A1.

Figure 23:
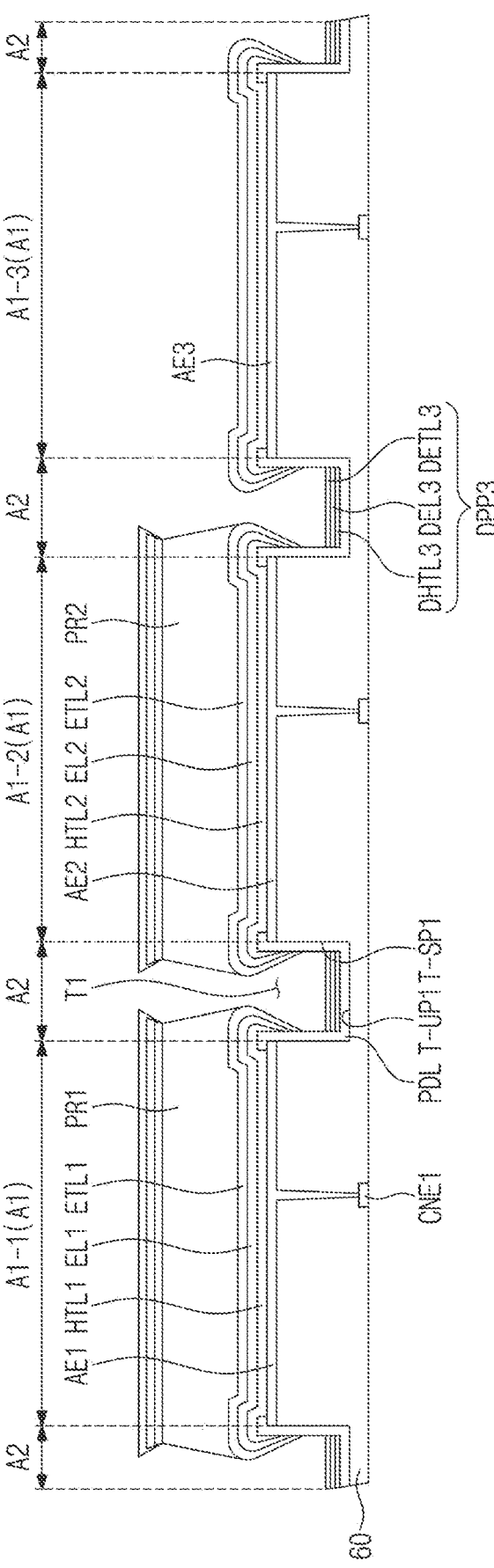

Referring to FIG. 23, the same method used for forming the first emission structure HTL1, EL1, and ETL1 (see, e.g., FIGS. 15A to 17B) may be employed to form a third hole transport layer HTL3, a third emission layer EL3, and a third electron transport layer ETL3. These steps may also form a third dummy hole transport layer DHTL3, a third dummy emission layer DEL3, and a third dummy electron transport layer DETL3 that overlap the second area A2.

Figure 24:
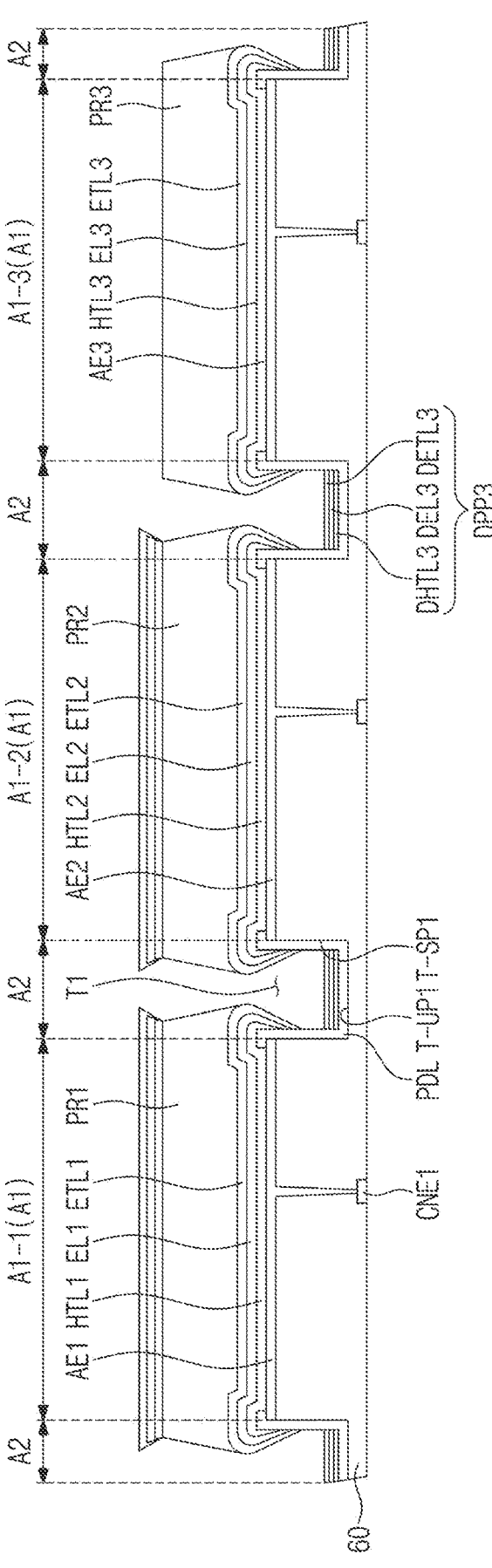

Referring to FIG. 24, a third mask pattern PR3 may be formed to overlap a third color area A1-3 from among the plurality of first areas A1. The third mask pattern PR3 may expose the third dummy electron transport layer DETL3 while covering a top surface of the third electron transport layer ETL3 that overlaps the third color area A1-3.

Figure 25:
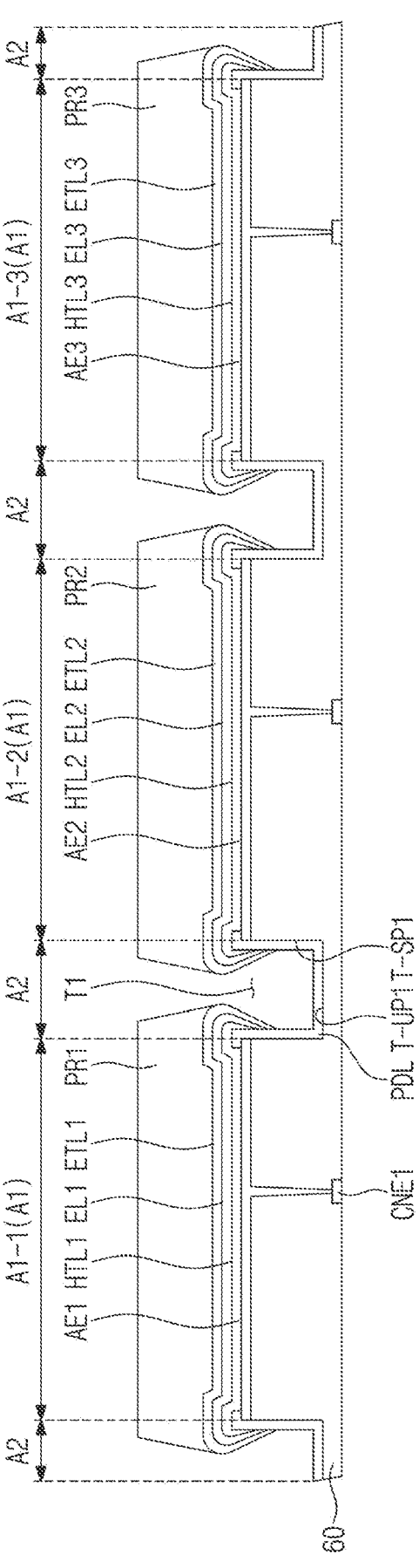

Referring to FIG. 25, a third dummy pattern DPP3, which includes the third dummy hole transport layer DHTL3, the third dummy emission layer DEL3, and the third dummy electron transport layer DETL3 that overlap the second area A2, may be removed.

Through the series of processes (or steps) discussed in FIGS. 23 to 25, the sixth insulating layer 60 may be provided thereon with a third stack that includes the third mask pattern PR3 and a third emission structure HTL3, EL3, and ETL3 that overlaps the third color area A1-3 from among the plurality of first areas A1.

Figure 26:
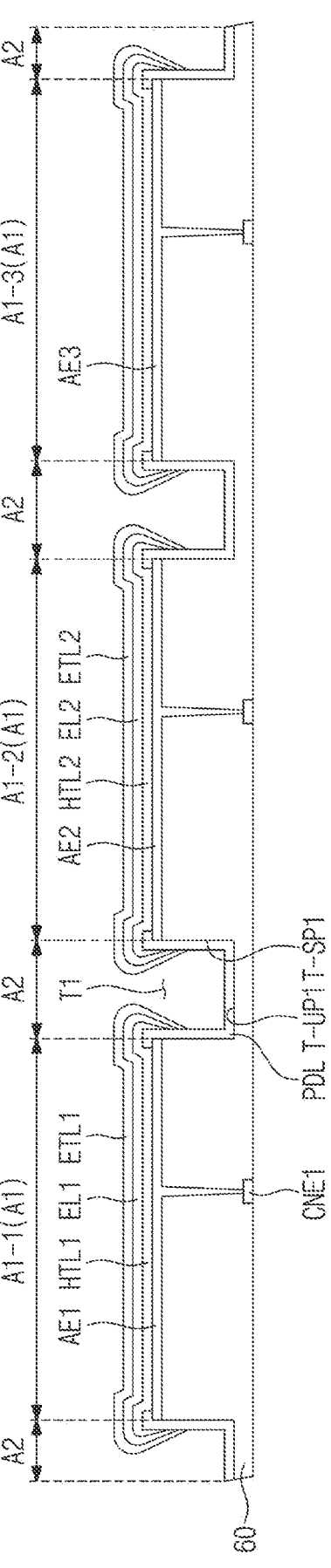

Referring to FIG. 26, a process may be performed to remove the first mask pattern PR1, the second mask pattern PR2, and the third mask pattern PR3 that overlap the first color area A1-1, the second color area A1-2, and the third color area A1-3, respectively.

Figure 27:
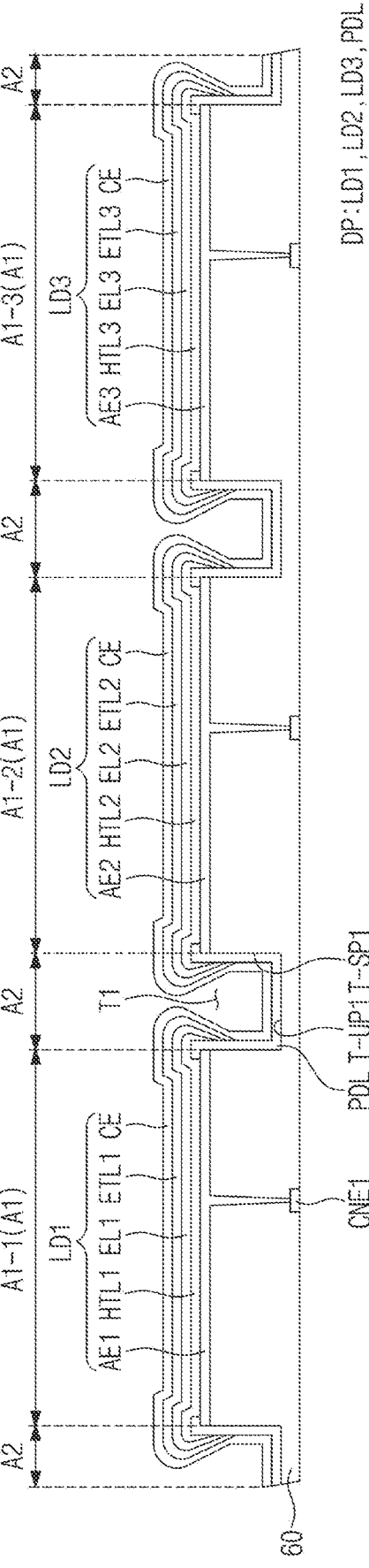

Referring to FIG. 27, a cathode electrode CE may be formed to overlap the second area A2 and the first, second, and third emission structures HTL1 to ETL1, HTL2 to ETL2, and HTL3 to ETL3. The cathode electrode CE may continuously extend to overlap the plurality of first areas A1 and the second area A2.

Figure 28:
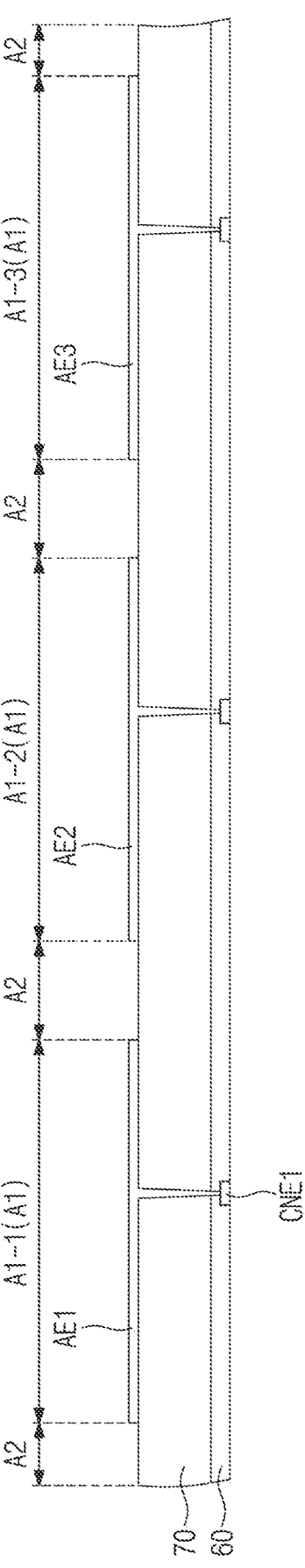
FIGS. 28 and 29 are cross-sectional views of steps of a method of fabricating a display device according to an embodiment of the present disclosure.
Figure 29:
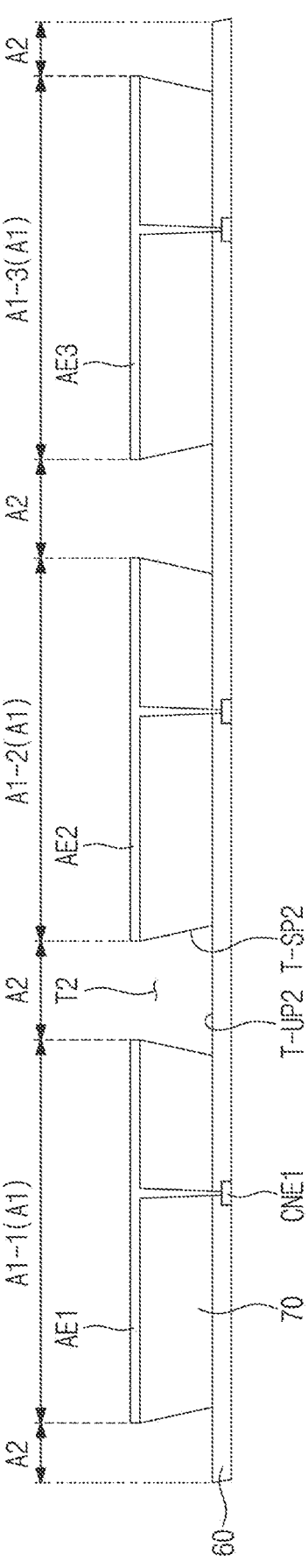

FIGS. 28 and 29 are cross-sectional views showing steps of a method of fabricating a display device (see, e.g., DD in FIG. 2) according to an embodiment of the present disclosure.

Referring to FIGS. 28 and 29, the method of fabricating a semiconductor device may be the same as the method of fabricating a semiconductor device described with respect to FIGS. 12 to 27 except for the procedure for forming a sixth insulating layer 60, a seventh insulating layer 70, and a hole (e.g., an opening) T2. The same or substantially similar steps will not be described or will be only briefly described for clarity.

Referring to FIG. 28, a sixth insulating layer 60 (e.g., a first organic layer) may be formed on a base substrate (see, e.g., 110 in FIG. 6) that has a plurality of first areas A1 and a second area A2 disposed adjacent to the plurality of first areas A1. A seventh insulating layer 70 (e.g., a second organic layer) may be formed on the sixth insulating layer 60. FIG. 28 omits illustration of a plurality of layers disposed below the sixth insulating layer 60 for clarity.

First to third anode electrodes AE1 to AE3 may be formed on the sixth insulating layer 60 to respectively correspond to the plurality of first areas A1. Each of the first to third anode electrodes AE1 to AE3 may be connected to a corresponding one of first connection electrodes CNE1 through a contact hole (e.g., a contact opening) that penetrates (or extends through) the sixth insulating layer 60.

Referring to FIG. 29, a hole (e.g., an opening) T2 may be formed to penetrate (or extend through) the seventh insulating layer 70. The hole T2 may be defined by an inner lateral surface T-SP2 of the seventh insulating layer 70 and a top surface T-UP2 of the sixth insulating layer 60. The hole T2 may be formed through a dry etching process or a wet etching process.

The hole T2 may be formed to have a width that increases with decreasing distance from the sixth insulating layer 60. A minimum (or smallest) width of the hole T2 may be equal to or less than about 2 μm.

According to embodiments of the present disclosure, a groove may be formed in an organic layer, and at an area other than where the groove is formed, an emission layer, a charge transport layer, and a second electrode may be sequentially stacked to cover their underlying layers, allowing for a reduction in an interval (or space) between pixels while ensuring that the emission layer is protected from external impact and contamination.

In addition, the emission layer, the charge transport layer, and the second electrode may be deposited without using a separate mask, and thus, process problems that arise when a mask is used may be avoided.

Although the present disclosure have been described herein with reference to a number of embodiments thereof, it will be understood by those of ordinary skill in the art that various changes in form and details may be made without departing from the spirit and scope of the present disclosure as set forth in the following claims and their equivalents. Thus, the technical scope of the present disclosure is not limited by the embodiments and examples described above but by the following claims and their equivalents.

What is claimed is:

1. A display device comprising:
a base substrate having a plurality of first areas and a second area adjacent to the plurality of first areas;
an organic layer on the base substrate and having a groove therein corresponding to the second area;
a first electrode on the organic layer and overlapping one first area from among the plurality of first areas;
a first charge transport layer on the first electrode and having an edge part facing a partial region of an inner lateral surface of the organic layer that defines the groove;
an emission layer covering the first charge transport layer;
a second charge transport layer covering the emission layer and comprising an inorganic material; and
a second electrode covering the second charge transport layer and overlapping a bottom surface of the organic layer defining the groove.

2. The display device of claim 1, wherein an edge part of the emission layer is closer to the bottom surface of the groove than the edge part of the first charge transport layer is, and
wherein an edge part of the second charge transport layer is closer to the bottom surface of the groove than the edge part of the emission layer is.

3. The display device of claim 1, further comprising a pixel definition layer covering the inner lateral surface of the organic layer defining the groove and an edge of the first electrode.

4. The display device of claim 3, wherein, when viewed in a vertical cross-section, a contact distance between the pixel definition layer and an edge part of the second charge transport layer is equal to or greater than 10 nm and equal to or less than 150 nm.

5. The display device of claim 3, wherein, when viewed in a vertical cross-section, a contact distance between the pixel definition layer and an edge part of the emission layer is equal to or greater than 10 nm and equal to or less than 150 nm.

6. The display device of claim 1, wherein, when viewed in a plan view, the groove surrounds the first electrode.

7. The display device of claim 1, wherein the first electrode is an anode electrode,
wherein the first charge transport layer is a hole transport layer,
wherein the second charge transport layer is an electron transport layer, and
wherein the second electrode is a cathode electrode.

8. The display device of claim 1, wherein the first electrode is a cathode electrode,
wherein the first charge transport layer is an electron transport layer,
wherein the second charge transport layer is a hole transport layer, and
wherein the second electrode is an anode electrode.

9. The display device of claim 1, wherein a width of the groove in the organic layer is equal to or less than 2 μm.

10. The display device of claim 1, wherein an angle between the inner lateral surface of the organic layer and the bottom surface of the organic layer that define the groove is equal to or greater than 80°.

11. A display device comprising:
a base substrate having a plurality of first areas and a second area adjacent to the plurality of first areas;
a first organic layer on the base substrate;

a second organic layer on the first organic layer and having a hole therein corresponding to the second area;
a first electrode on the second organic layer and overlapping one first area from among the plurality of first areas;
a first charge transport layer on the first electrode and having an edge part facing a partial region of an inner lateral surface of the second organic layer that defines the hole;
an emission layer covering the first charge transport layer;
a second charge transport layer covering the emission layer and comprising an inorganic material; and
a second electrode covering the second charge transport layer and overlapping a bottom surface of the second organic layer defining the hole.

12. The display device of claim 11, further comprising a pixel definition layer covering the inner lateral surface of the second organic layer defining the hole and an edge of the first electrode.

13. The display device of claim 11, wherein a width of the hole increases with decreasing distance from the base substrate along a normal direction of the base substrate.

14. The display device of claim 13, wherein a smallest width of the hole is equal to or less than 2 μm.

15. A method of fabricating a display device, the method comprising:
forming an organic layer on a base substrate and a plurality of first electrodes on the organic layer, the base substrate having a plurality of first areas and a second area adjacent to the plurality of first areas, the plurality of first electrodes corresponding to the plurality of first areas, respectively;
forming a groove in the organic layer and corresponding to the second area;
forming, on the organic layer, a first stack comprising a first emission structure and a first mask pattern on the first emission structure, the first emission structure overlapping a first color area from among the plurality of first areas;
removing the first mask pattern; and
forming a second electrode to overlap the first emission structure and the second area,
wherein the forming of the first stack comprises:
performing a first deposition step in which a first deposition material is provided at a first incidence angle to form, on the first electrode, a first charge transport layer having an edge part and a first charge dummy transport layer that overlaps the second area, the edge part of the first charge transport layer facing a partial region of an inner lateral surface of the organic layer that defines the groove;
performing a second deposition step in which a second deposition material is provided at a second incidence angle to form an emission layer that covers the first charge transport layer and a dummy emission layer that overlaps the second area;
performing a third deposition step in which a third deposition material is provided at a third incidence angle to form a second charge transport layer that covers the emission layer and a second charge dummy transport layer that overlaps the second area, the second charge transport layer comprising an inorganic material;
forming the first mask pattern that covers a top surface of the second charge transport layer and exposes the second charge dummy transport layer; and removing the second charge dummy transport layer, the dummy emission layer, and the first charge dummy transport layer.

16. The method of claim 15, wherein the first incidence angle is less than the second incidence angle, and wherein the second incidence angle is less than the third incidence angle.

17. The method of claim 15, wherein the first incidence angle is equal to or greater than 50° and equal to or less than 70°, wherein the second incidence angle is equal to or greater than 60° and equal to or less than 80°, and wherein the third incidence angle is equal to or greater than 70° and less than 90°.

18. The method of claim 15, further comprising, after the forming of the first stack:

forming, on the organic layer, a second stack comprising a second emission structure and a second mask pattern on the second emission structure, the second emission structure overlapping a second color area from among the plurality of first areas; and forming, on the organic layer, a third stack comprising a third emission structure and a third mask pattern on the third emission structure, the third emission structure overlapping a third color area from among the plurality of first areas.

19. The method of claim 18, wherein the second mask pattern and the third mask pattern are simultaneously removed when the first mask pattern is removed.

20. The method of claim 15, wherein the organic layer comprises:

a first organic layer on the base substrate; and a second organic layer on the first organic layer, wherein the groove extends through the second organic layer and has a width that increases with decreasing distance from the base substrate along a normal direction relative to the base substrate.

21. An electronic apparatus including a display device generating an image, and an electronic module below the display device, the display device comprising:

a base substrate having a plurality of first areas and a second area adjacent to the plurality of first areas;

an organic layer on the base substrate and having a groove therein corresponding to the second area;

a first electrode on the organic layer and overlapping one first area from among the plurality of first areas;

a first charge transport layer on the first electrode and having an edge part facing a partial region of an inner lateral surface of the organic layer that defines the groove;

an emission layer covering the first charge transport layer;

a second charge transport layer covering the emission layer and comprising an inorganic material; and a second electrode covering the second charge transport layer and overlapping a bottom surface of the organic layer defining the groove.

* * * * *